United States Patent
Lu

(10) Patent No.: US 10,497,657 B1
(45) Date of Patent: Dec. 3, 2019

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/007,745

(22) Filed: Jun. 13, 2018

(51) Int. Cl.
| | |
|---|---|
| *H01L 23/48* | (2006.01) |
| *H01L 23/52* | (2006.01) |
| *H01L 29/40* | (2006.01) |
| *H01L 23/00* | (2006.01) |

(52) U.S. Cl.
CPC ...... *H01L 24/02* (2013.01); *H01L 2224/0235* (2013.01); *H01L 2224/02311* (2013.01); *H01L 2224/02331* (2013.01); *H01L 2224/02333* (2013.01); *H01L 2224/02373* (2013.01); *H01L 2224/02377* (2013.01); *H01L 2224/02379* (2013.01); *H01L 2924/381* (2013.01)

(58) Field of Classification Search
CPC ........... H01L 23/15; H01L 2224/73204; H01L 2224/1308; H01L 24/81; H01L 2224/16145; H01L 2224/13; H01L 2224/13017; H01L 2224/81345; H01L 33/54
USPC .................................................. 257/780, 781
See application file for complete search history.

(56) References Cited

U.S. PATENT DOCUMENTS

| | | | | |
|---|---|---|---|---|
| 5,600,180 A | * | 2/1997 | Kusaka | H01L 21/563 257/692 |
| 7,737,552 B2 | * | 6/2010 | Beyne | H01L 23/3128 257/724 |
| 7,781,886 B2 | * | 8/2010 | Trezza | H01L 21/76898 257/723 |
| 8,508,054 B2 | * | 8/2013 | Pang | H01L 24/81 257/738 |
| 8,624,404 B1 | * | 1/2014 | Su | H01L 23/3192 257/738 |
| 8,810,029 B2 | * | 8/2014 | Pendse | H01L 21/563 257/734 |
| 8,810,043 B2 | * | 8/2014 | Nishimura | H01L 21/563 257/780 |
| 2015/0014847 A1 | | 1/2015 | Mohammed et al. | |

* cited by examiner

*Primary Examiner* — S. V. Clark
(74) *Attorney, Agent, or Firm* — Foley & Lardner LLP; Cliff Z. Liu

(57) ABSTRACT

A semiconductor package device is provided that includes a first circuit layer having a first conductive layer and a first stud bump and a second circuit layer having a second conductive layer and a second stud bump. The first stud bump has a first portion and a second portion, and the second portion of the first stud bump is electrically connected to the second conductive layer. The second stud bump has a first portion and a second portion, and the second portion of the second stud bump is electrically connected to the first conductive layer. The first stud bump partially overlaps the second stud bump in a direction substantially perpendicular to the first circuit layer.

20 Claims, 30 Drawing Sheets

SEMICONDUCTOR PACKAGE DEVICE AND METHOD OF MANUFACTURING THE SAME

BACKGROUND

1. Technical Field

The present disclosure relates generally to a semiconductor package device and a method of manufacturing the same, and to a semiconductor package device including conductive bumps and a method of manufacturing the same.

2. Description of the Related Art

In semiconductor structures, conductive pillars (for example, copper (Cu) pillars) are used as the interconnections between structure layers. Due to manufacturing constraints, the minimum width of a conductive pillar is around 20 μm and thus the pitch (the width of a conductive pillar plus the space between adjacent pillars) of the conductive pillar is around 40 μm. As a result, the pitch of a conductive layer that is electrically connected to the conductive pillar is at least 40 μm. As the I/O numbers of a semiconductor package increase, the pitch of a conductive layer should be further reduced to accommodate the increasing I/O numbers.

SUMMARY

In one or more embodiments, a semiconductor package device includes a first circuit layer having a first conductive layer, and a first stud bump and a second circuit layer having a second conductive layer and a second stud bump. The first stud bump has a first portion and a second portion, and the second portion of the first stud bump is electrically connected to the second conductive layer. The second stud bump has a first portion and a second portion, and the second portion of the second stud bump is electrically connected to the first conductive layer. The first stud bump partially overlaps the second stud bump in a direction substantially perpendicular to the first circuit layer.

In one or more embodiments, a semiconductor package device includes a first circuit layer having a first conductive layer and a first stud bump and a second circuit layer having a second conductive layer and a second stud bump. The first stud bump has a first portion and a second portion, and the second portion of the first stud bump is electrically connected to the second conductive layer. The second stud bump has a first portion and a second portion, and the second portion of the second stud bump is electrically connected to the first conductive layer. The first stud bump has a shape in accordance with the equation $d<D-2(t/\tan\theta)$. In this equation, d is the width of an interface between the second portion of the first stud bump and the second conductive layer, D is the width of a bottom surface the first stud bump, t is the distance between the interface and the bottom surface the first stud bump, and θ is the angle defined by the bottom surface of the first stud bump and a surface connecting the widest portion of the first stud bump and the edge of the bottom surface of the first stud bump.

In one or more embodiments, a semiconductor package device includes a first circuit layer having a first conductive layer and a first stud bump and a second circuit layer having a second conductive layer and a second stud bump. The first stud bump has a first portion and a second portion, and the second portion of the first stud bump is electrically connected to the second conductive layer. The width of the widest portion of the first stud bump is greater than the width of the second conductive layer.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
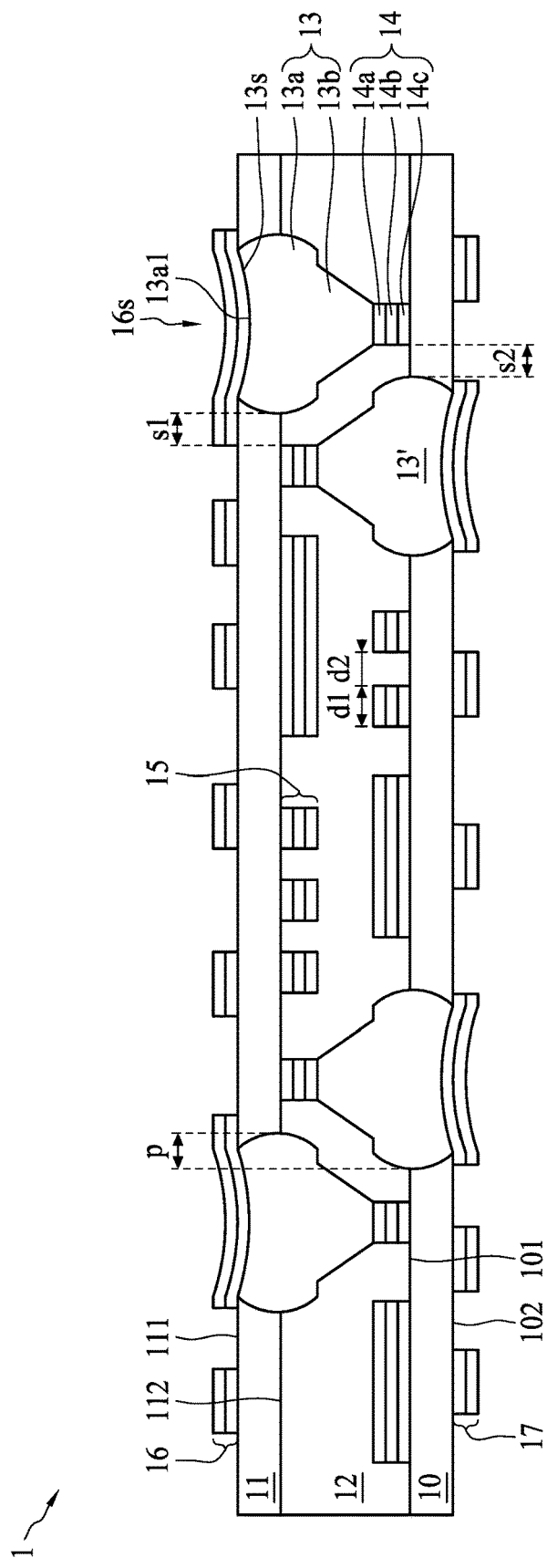
FIG. 1 illustrates a cross-sectional view of a semiconductor package device in accordance with some embodiments of the present disclosure.

FIG. 1 illustrates a cross-sectional view of a connection structure 1 in accordance with some embodiments of the present disclosure. The connection structure 1 includes passivation layers 10, 11 and 12, conductive bumps 13 and 13', and conductive layers (redistribution layers) 14, 15, 16 and 17.

In some embodiments, the passivation layer 11, the conductive bump 13, the conductive layer 15 and the conductive layer 16 are collectively referred to as a first circuit layer. In some embodiments, the passivation layer 10, the conductive bump 13', the conductive layer 14 and the conductive layer 17 are collectively referred to as a second circuit layer. In some embodiments, the conductive layer 14 is a multi-layered conductive layer. In some embodiments, the conductive layer 14 includes a first layer 14a, a second layer 14b and a third layer 14c. In some embodiments, the first layer 14a includes a solder alloy. In some embodiments, the second layer 14b includes copper (Cu). In some embodiments, the third layer 14c includes titanium (Ti), nickel (Ni), tungsten (W), another metal, or a combination of two or more thereof. In some embodiments, the conductive layer 15 is a multi-layered conductive layer. In some embodiments, the conductive layer 15 includes substantially the same structure and materials as the conductive layer 14.

In some embodiments, each of the passivation layers 10, 11 and 12 includes, for example, one or more organic materials (e.g., a molding compound, bismaleimide triazine (BT), a polyimide (PI), a polybenzoxazole (PBO), a solder resist, an Ajinomoto build-up film (ABF), a polypropylene (PP), an epoxy-based material, or a combination of two or more thereof), inorganic materials (e.g., silicon, a glass, a ceramic, a quartz, or a combination of two or more thereof), liquid-film material(s) or dry-film material(s), or a combination of two or more thereof. In some embodiments, the passivation layers 10, 11 and 12 include identical materials. In some embodiments, the passivation layers 10, 11 and 12 include different materials from each other.

The passivation layer 10 includes a surface 101 and a surface 102 opposite to the surface 101. The conductive layer 14 is disposed on the surface 101 and the conductive layer 17 is disposed on the surface 102. The passivation layer 11 includes a surface 111 and a surface 112 opposite to the surface 111. The conductive layer 16 is disposed on the surface 111 and the conductive layer 15 is disposed on the surface 112. The passivation layer 12 covers a portion of the conductive bumps 13 and 13'. The passivation layer 12 covers the conductive layers 14 and 15. The passivation layer 12 also covers the surface 101 and the surface 112. In some embodiments, the conductive layer 16 is a multi-layered conductive layer. In some embodiments, the conductive layer 17 is a multi-layered conductive layer.

Referring to FIG. 1, the conductive bump 13 includes a main body 13a and a protruding portion 13b disposed on and/or protruding from the main body 13a. Referring to FIG. 1, the maximum width of the main body 13a is greater than the maximum width of the protruding portion 13b. In some embodiments, the conductive bump 13 may be or may include gold (Au), silver (Ag), copper (Cu), another metal, a solder alloy, or a combination of two or more thereof. In some embodiments, the conductive bump 13 is formed by a wire bonding machine. In some embodiments, the conductive bump 13 further includes a curved surface/recess 13s on its main body 13a resulting from manufacturing. For example, a surface 13a1 of the conductive bump 13 is recessed into the surface 111 of the passivation layer 11. In some embodiments, a portion of the conductive layer 16 includes a curved portion 16s disposed conformal to the curved surface/recess 13s. For example, the portion of the conductive layer 16 on the main body 13a of the conductive bump 13 includes a curved portion 16s (or a recess). In some embodiments, the conductive bump 13' includes substantially the same shape and material as the conductive bump 13. Alternatively, the conductive bump 13 and the conductive bump 13' may include different shapes and materials depending on different embodiments.

Referring to FIG. 1, the conductive bump 13 (which can be, for example, a stub bump) and the conductive bump 13' are arranged in a staggered manner. In some embodiments, the conductive bump 13 partially overlaps the conductive bump 13' in a direction substantially perpendicular to the surface 112 of the passivation layer 10. For example, a portion of the main body 13a of the conductive bump 13 overlaps a portion of the main body of the conductive bump 13' in the direction substantially perpendicular to the surface 112 of the passivation layer 10. For example, a portion of the protruding portion 13b of the conductive bump 13 overlaps a portion of the protruding portion of the conductive bump 13' in the direction substantially perpendicular to the surface 112 of the passivation layer 10. The distance p shown in FIG. 1 indicates the overlap between the conductive bumps 13 and 13'. The distance s1 in FIG. 1 indicates a minimum distance between the conductive bump 13 and the conductive layer 15. The distance s2 in FIG. 1 indicates a minimum distance between the conductive bump 13' and the conductive layer 14. In some embodiments, the distance s1 is equal to or greater than 2 micrometers (μm). In some embodiments, the distance s1 is equal to or less than 5 μm. In some embodiments, the distance s1 is substantially equal to the distance s2.

Due to shape and the arrangement of the conductive bumps 13 and 13', the distances s1 and s2 are much smaller compared to the distance between a Cu pillar and its adjacent conductive layer in existing semiconductor structures. For example, the minimum distance between a Cu pillar and its adjacent conductive layer is greater than 20 μm in existing semiconductor structures while the distances s1 and s2 can be equal to or less than 5 μm. Therefore, the pitch of the conductive layers 13 and 14 as shown in FIG. 1 can be reduced, which would reduce a size of a chip or accommodate more I/O pins.

The conductive bumps 13 and 13' connect the passivation layers 10 and 11 to provide electrical connections therebetween. For example, the main body 13a of the conductive bump 13 is electrically connected to the conductive layer 16 on the passivation layer 11 and the protruding portion 13b of the conductive bump 13 is electrically connected to the conductive layer 14. For example, the protruding portion 13b of the conductive bump 13 may sink into the conductive layer 14. For example, a portion of the protruding portion 13b of the conductive bump 13 is embedded into the conductive layer 14. This would increase the strength of the connection between the conductive bump 13 and the conductive layer 14 to avoid delamination therebetween. In some embodiments, the protruding portion 13b of the conductive bump 13 provides a fine-pitch connection. For example, the protruding portion 13b of the conductive bump 13 can be connected to a fine-pitch conductive trace or pad (e.g., L/S equal to or less than 2 μm/2 μm).

In some embodiments, the passivation layer 10 includes a thickness in a range of 5 μm to 30 μm. In some embodiments, the passivation layer 11 includes a thickness in a range of 5 μm to 30 μm. In some embodiments, the passivation layer 12 includes a thickness in a range of 30 μm to 1200 μm. In some embodiments, the first layer 14a includes a thickness in a range of 2 μm to 10 μm. In some embodiments, the second layer 14b includes a thickness in a range of 0.5 μm to 3 μm. In some embodiments, the third layer 14c includes a thickness in a range of 0.1 μm to 1 μm. In some embodiments, the line space (L/S, i.e., d1/d2) of the conductive layer 14 is in a range of 2 μm/2 μm to 5 μm/5 μm. In some embodiments, the width of the main body 13a of the conductive bump 13 is in a range of 9.6 μm to 60 μm. In some embodiments, the conductive layers 16 and 17 include a thickness in a range of 0.6 μm to 3.3 μm.

Figure 2A:
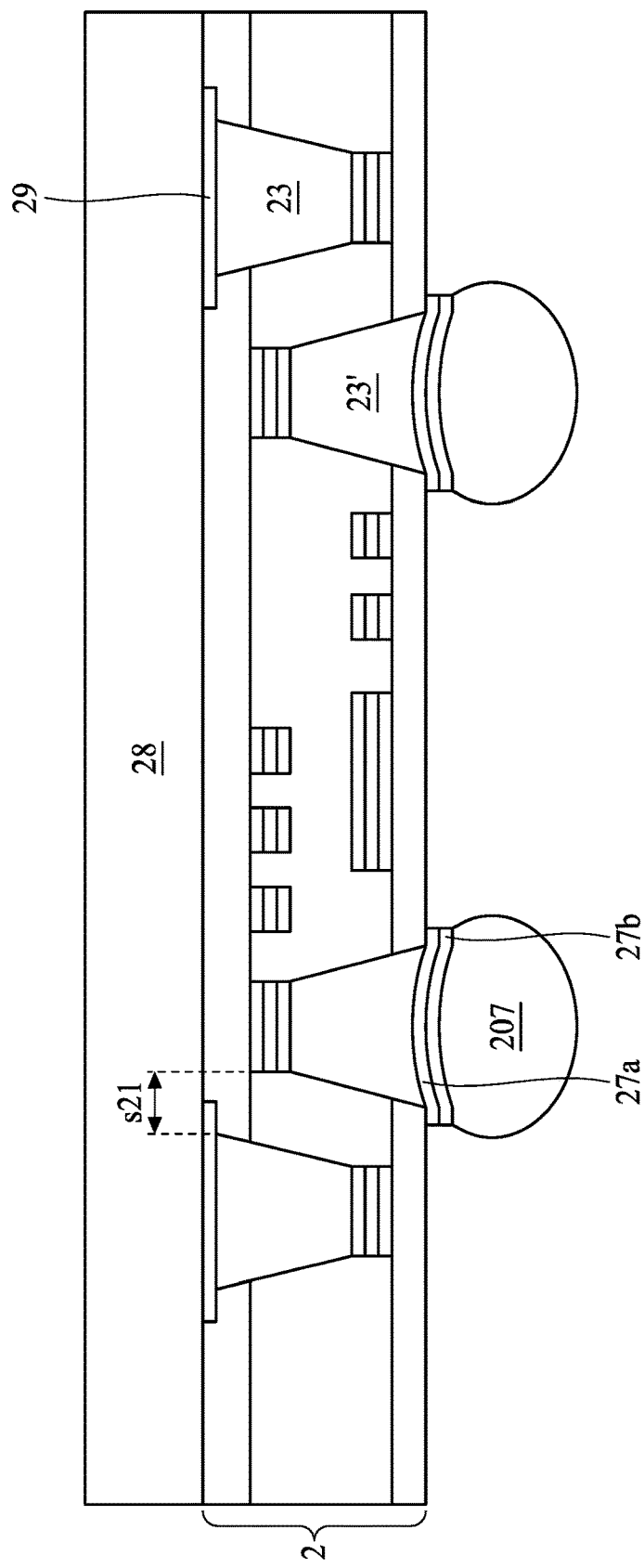
FIG. 2A illustrates a cross-sectional view of a semiconductor package device in accordance with some embodiments of the present disclosure.

FIG. 2A illustrates a cross-sectional view of a semiconductor package device in accordance with some embodiments of the present disclosure. The semiconductor package device of FIG. 2A includes a chip or a die 28 mounted to a semiconductor substrate 2. The semiconductor substrate 2 is similar to the connection structure 1 of FIG. 1, except that the conductive bumps 23 and 23' each include a trapezoidal shape, and that the conductive layers 16 and 17 of FIG. 1 are excluded. The conductive bump 23 is electrically connected to the die 28 through a conductive pad 29. A soldering bump 207 is electrically connected to the conductive bump 23' through a barrier layer 27a and a soldering layer 27b. In order to avoid a short circuit between the conductive bumps 23 and 23', a distance should be kept between the conductive bumps 23 and 23'. For example, there is a gap between the adjacent conductive bumps 23 and 23'. That is, the conductive bumps 23 and 23' cannot be overlapped in a direction perpendicular to the die 28 (e.g., in a vertical direction). As a result, the minimum distance s21 of FIG. 2A between the conductive bump 23 and its adjacent conductive layer will be greater than that shown in FIG. 1.

Figure 2B:
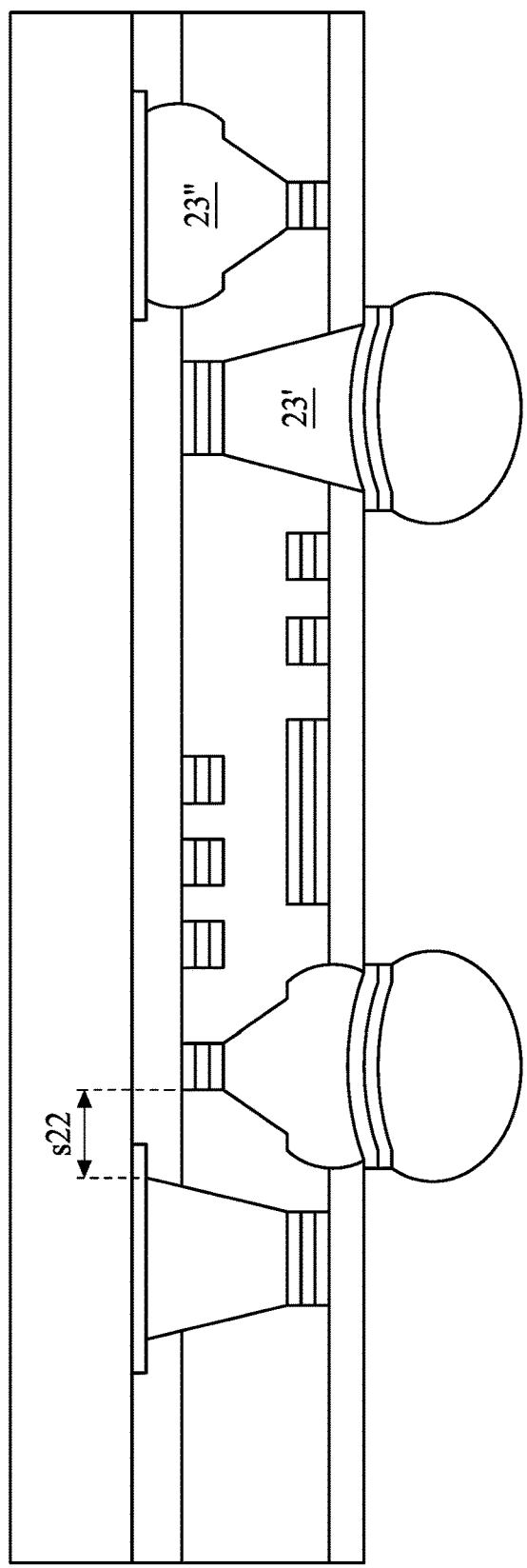
FIG. 2B illustrates a cross-sectional view of a semiconductor package device in accordance with some embodiments of the present disclosure.

FIG. 2B illustrates a cross-sectional view of a semiconductor package device in accordance with some embodiments of the present disclosure. The semiconductor package device of FIG. 2B is similar to that of FIG. 2A, except that the conductive bump 23" has a shape similar to that of the conductive bump 13 of FIG. 1. In order to avoid a short circuit between the conductive bumps 23" and 23', a distance should be kept between the conductive bumps 23" and 23'. That is, the conductive bumps 23" and 23' cannot be overlapped in a direction perpendicular to the die 28. As a result the minimum distance s22 of FIG. 2B between the conductive bump 23 and its adjacent conductive layer will be greater than that shown in FIG. 1.

Figure 3A:
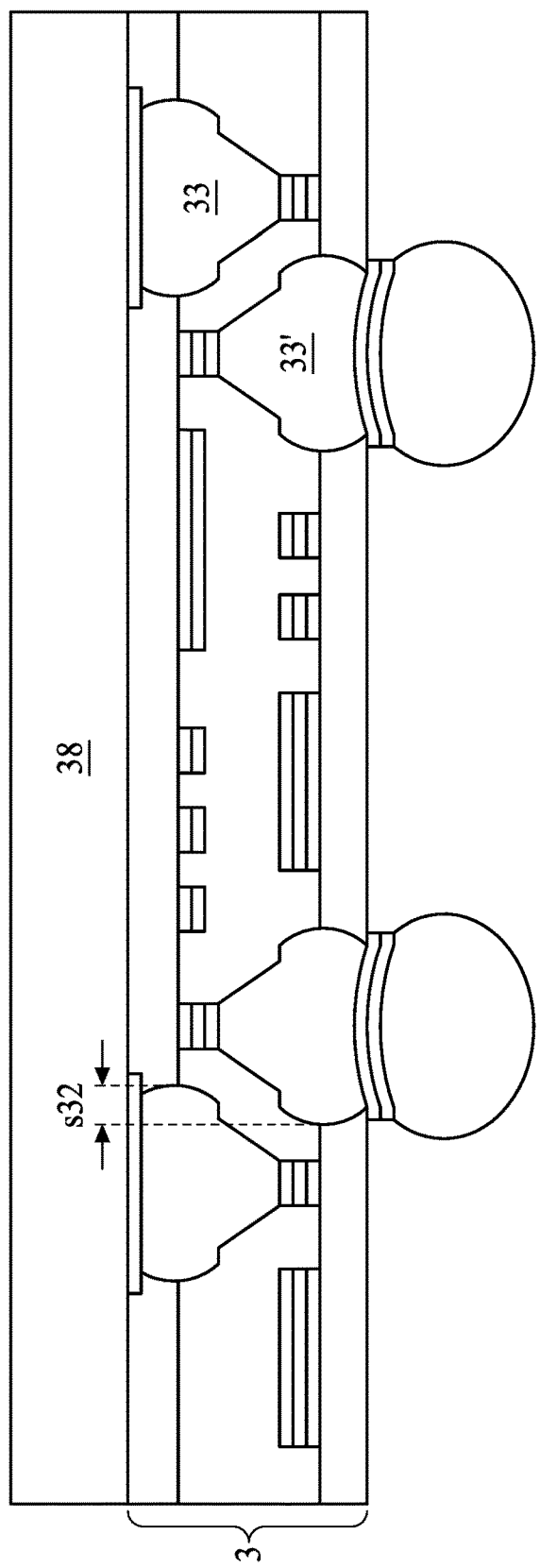
FIG. 3A illustrates a cross-sectional view of a semiconductor package device in accordance with some embodiments of the present disclosure.

FIG. 3A illustrates a cross-sectional view of a semiconductor package device in accordance with some embodiments of the present disclosure. The semiconductor package device of FIG. 3A includes a chip or a die 38 mounted to a semiconductor substrate 3. The semiconductor package device of FIG. 3A is similar to that of FIG. 2A, except that the conductive bumps 33 and 33' each have a shape similar to that of the conductive bump 13 of FIG. 1. Compared to the semiconductor package device in FIGS. 2A and 2B, the distance s32 is much smaller because the conductive bumps 33 and 33' are arranged in a staggered manner.

Figure 3B:
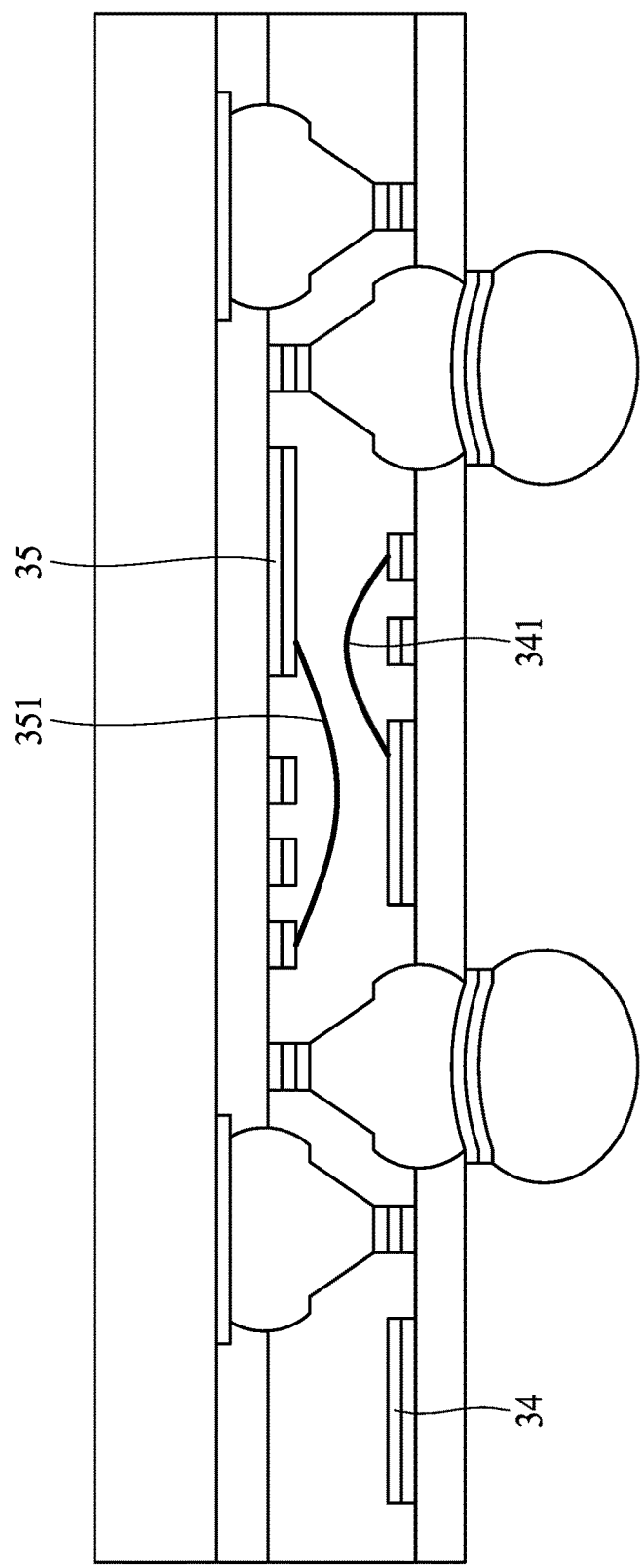
FIG. 3B illustrates a cross-sectional view of a semiconductor package device in accordance with some embodiments of the present disclosure.

FIG. 3B illustrates a cross-sectional view of a semiconductor package device in accordance with some embodiments of the present disclosure. The semiconductor package device of FIG. 3B is similar to that of FIG. 3A, except that the semiconductor package device of FIG. 3B further includes bounding wires 341 and 351. The bounding wire 341 is electrically connected between a first part and a second part of a conductive layer 34. The bounding wire 351 is electrically connected between a first part and a second part of a conductive layer 35.

Figure 3C:
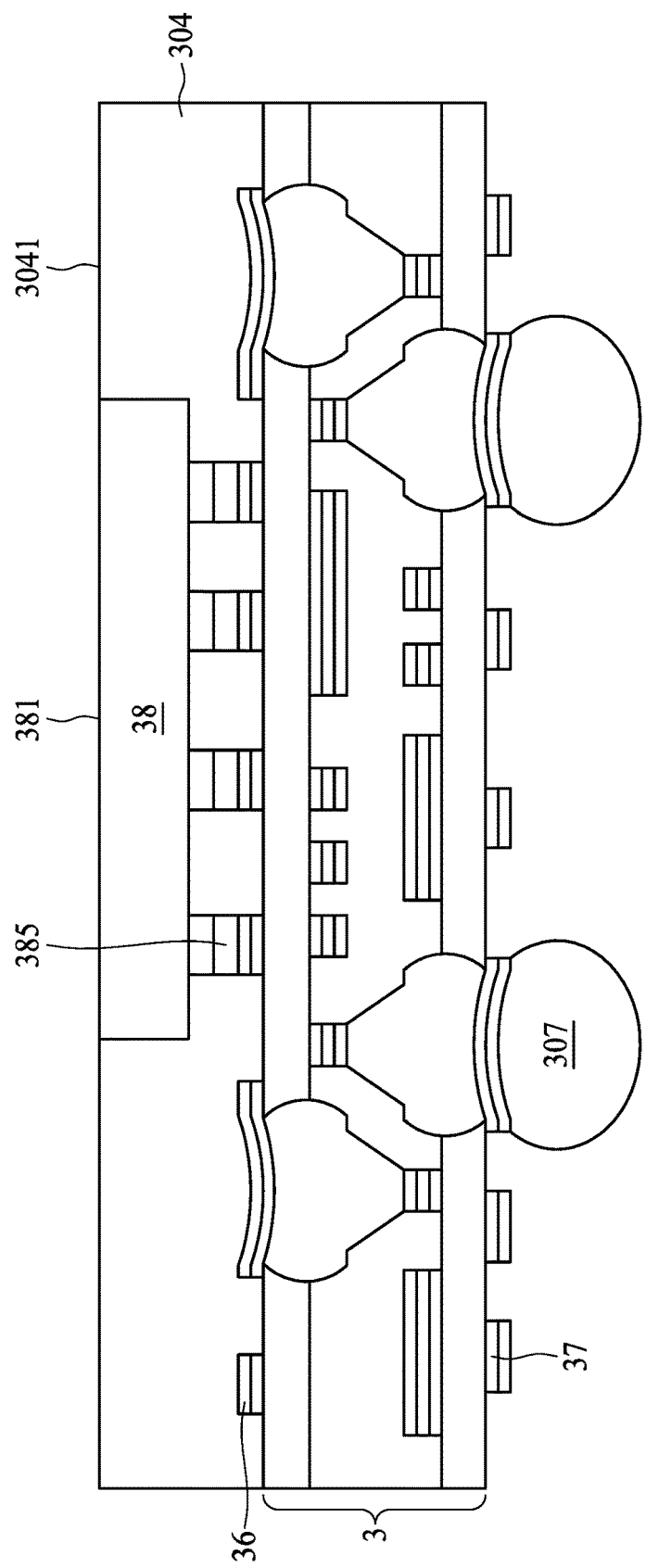
FIG. 3C illustrates a cross-sectional view of a semiconductor package device in accordance with some embodiments of the present disclosure.

FIG. 3C illustrates a cross-sectional view of a semiconductor package device in accordance with some embodiments of the present disclosure. The semiconductor package device of FIG. 3C includes a chip or a die 38 encapsulated by a package body 304 and mounted to a semiconductor substrate 3.

The package body 304 is disposed on the semiconductor substrate 3 and covers the die 38 and the conductive layer 36. In some embodiments, a backside surface 381 of the die 38 is substantially coplanar with a surface 3041 of the package body 304. In other embodiments, the package body 304 may cover the backside surface 381 of the die 38. In some embodiments, the package body 304 includes, for example, one or more organic materials (e.g., a molding compound, bismaleimide triazine (BT), a polyimide (PI), a polybenzoxazole (PBO), a solder resist, an Ajinomoto build-up film (ABF), a polypropylene (PP), an epoxy-based material, or a combination of two or more thereof), inorganic materials (e.g., silicon, a glass, a ceramic, a quartz, or a combination of two or more thereof), liquid-film material(s) or dry-film material(s), or a combination of two or more thereof.

The semiconductor substrate 3 is substantially identical to the connection structure 1 of FIG. 1. The die 38 is electrically connected to the conductive layer 36 through the conductive contact 385 (e.g., a micro bump). In some embodiments, the conductive layer 385 is a multi-layer conductive layer. A soldering bump 307 is electrically connected to the conductive layer 37. In some embodiments, the soldering bump 307 is a Controlled Collapse Chip Connection (C4) bump, a Ball Grid Array (BGA) or a Land Grid Array (LGA). In some embodiments, the soldering bump 307 can be used for a fan-in structure, a fan-out structure or a combination of the fan-in and fan-out structure. In some embodiments, there may be any number of dies on the semiconductor substrate 3 depending on design specifications.

Figure 3D:
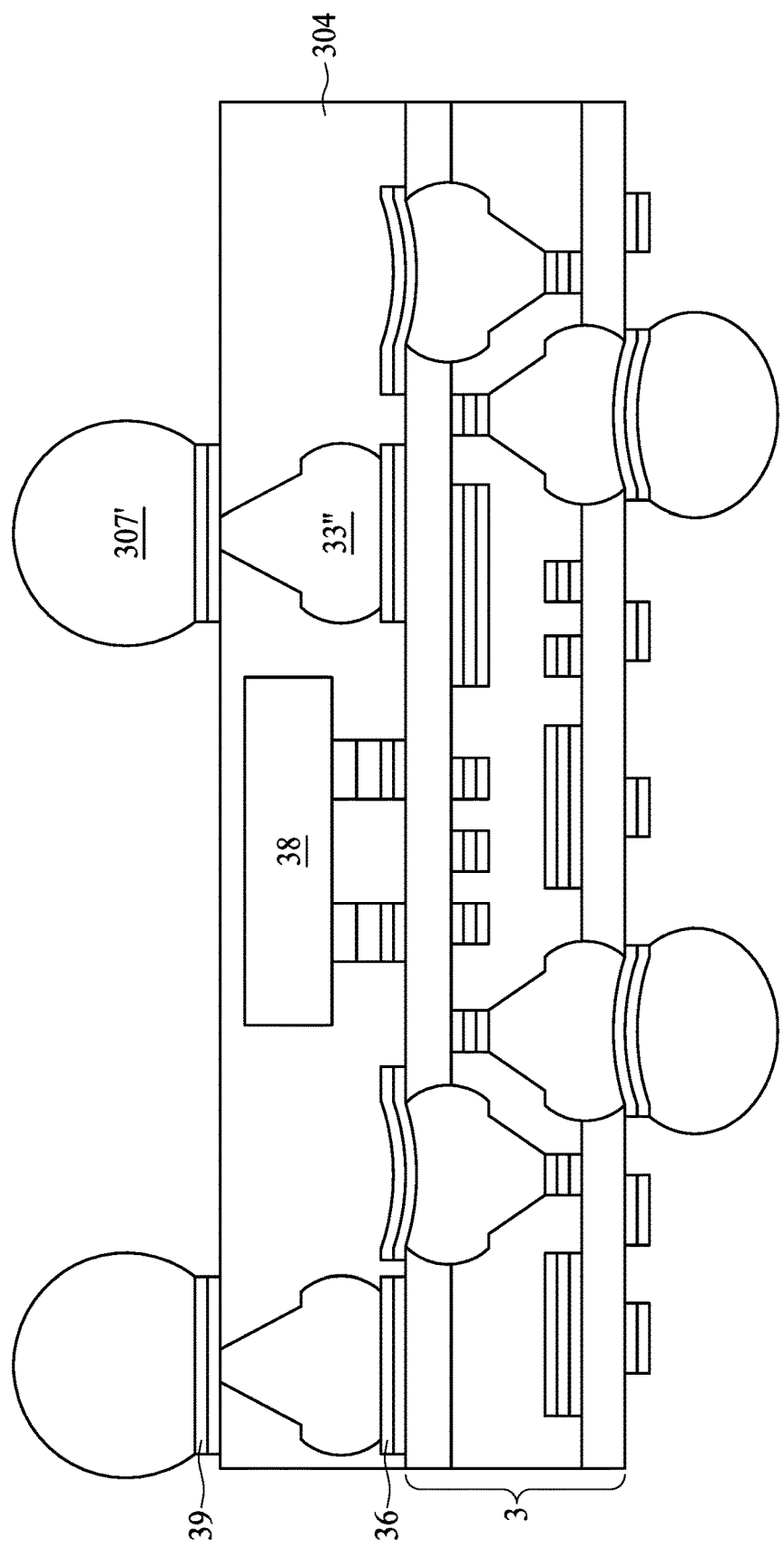
FIG. 3D illustrates a cross-sectional view of a semiconductor package device in accordance with some embodiments of the present disclosure.

FIG. 3D illustrates a cross-sectional view of a semiconductor package device in accordance with some embodiments of the present disclosure. The semiconductor package device of FIG. 3D is similar to that of FIG. 3C, except that the semiconductor package device of FIG. 3D further includes one or more conductive bumps 33" disposed on the semiconductor substrate 3 and encapsulated by the package body 304. The main body of the conductive bump 33" is electrically connected to the conductive layer 36 and a portion of the protruding portion is exposed from the package body 304. In some embodiments, the exposed portion of the conductive bump 33" is electrically connected to a soldering bump 307' through a conductive pad 39 disposed on a surface of the package body 304.

Figure 3E:
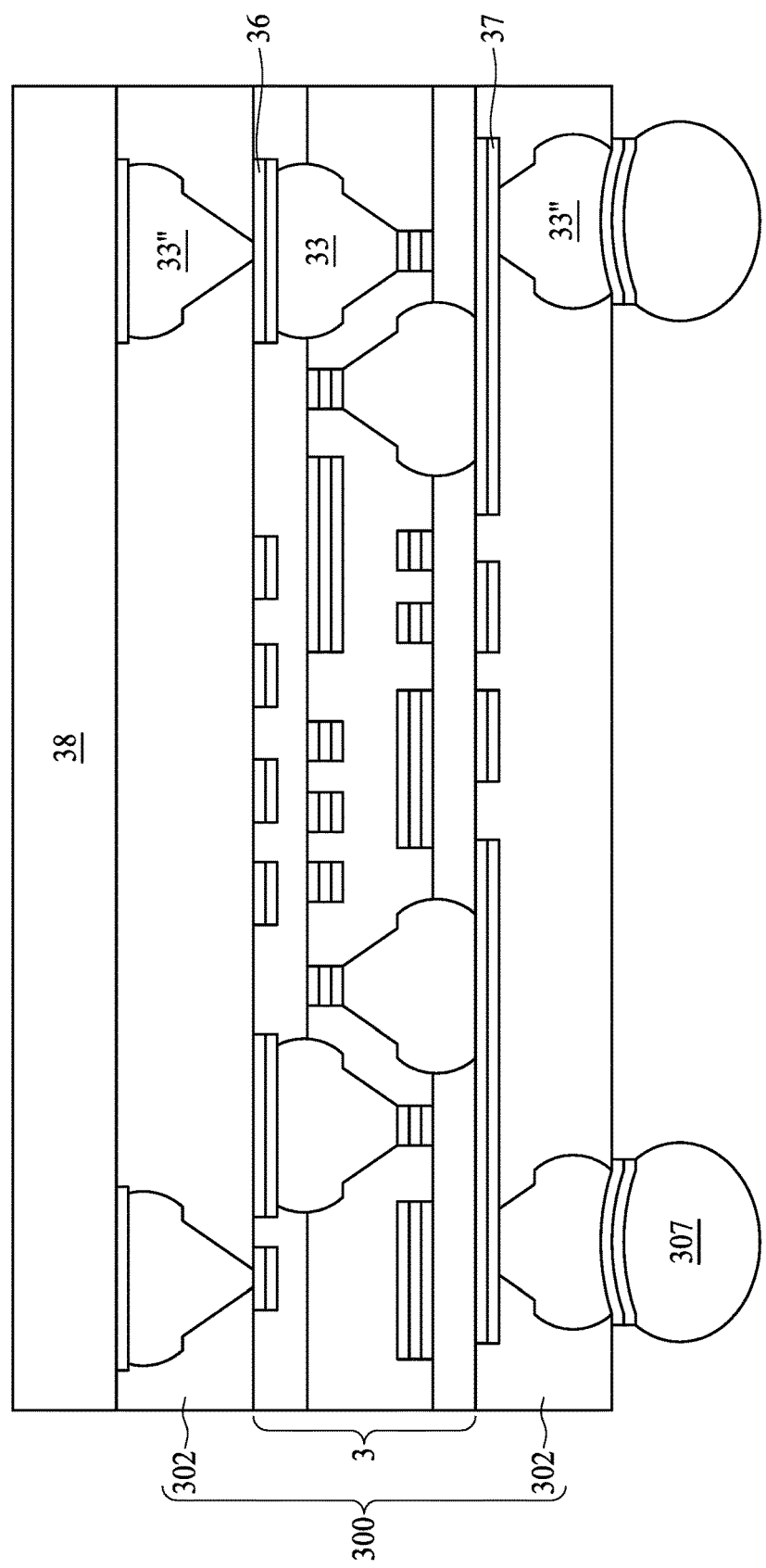
FIG. 3E illustrates a cross-sectional view of a semiconductor package device in accordance with some embodiments of the present disclosure.

FIG. 3E illustrates a cross-sectional view of a semiconductor package device in accordance with some embodiments of the present disclosure. The semiconductor package device of FIG. 3E includes a chip or a die 38 mounted to a substrate 300. The substrate 300 includes a semiconductor structure 3 and two passivation layers 302. The semiconductor structure 3 is sandwiched by the passivation layers 302. The semiconductor structure 3 is similar to the connection structure 1 of FIG. 1, except that the bottom surface of each of the conductive bumps is substantially flat. The semiconductor package device of FIG. 3E further includes conductive bumps 33" embedded in the passivation layers 302. Referring to FIG. 3E, the chip or die 38 is electrically connected to the conductive layer 36 through the conductive bump 33". A soldering bump 307 is electrically connected to the conductive layer 37 through the conductive bump 33".

Figure 3F:
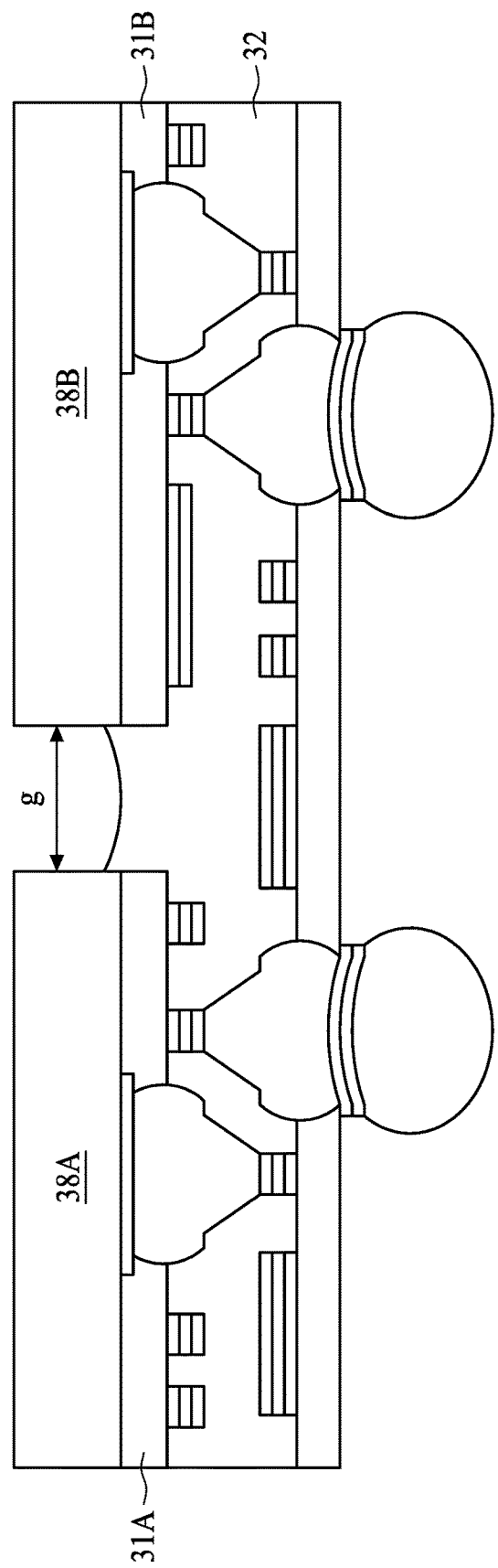
FIG. 3F illustrates a cross-sectional view of a semiconductor package device in accordance with some embodiments of the present disclosure.

FIG. 3F illustrates a cross-sectional view of a semiconductor package device in accordance with some embodiments of the present disclosure. The semiconductor package device of FIG. 3F is similar to that of FIG. 3A, except that the semiconductor package device of FIG. 3F includes a die 38A and a die 38B, and that the semiconductor package device of FIG. 3F includes a passivation layer 31A and a passivation layer 31B spaced apart by a gap g. The passivation layer 32 is exposed from the gap g and covers the lateral surfaces of the passivation layers 31A and 31B. In some embodiments, there are any numbers of dies on the corresponding passivation layers depending on different design requirements, and the adjacent passivation layers are spaced apart by a gap.

Figure 4A:
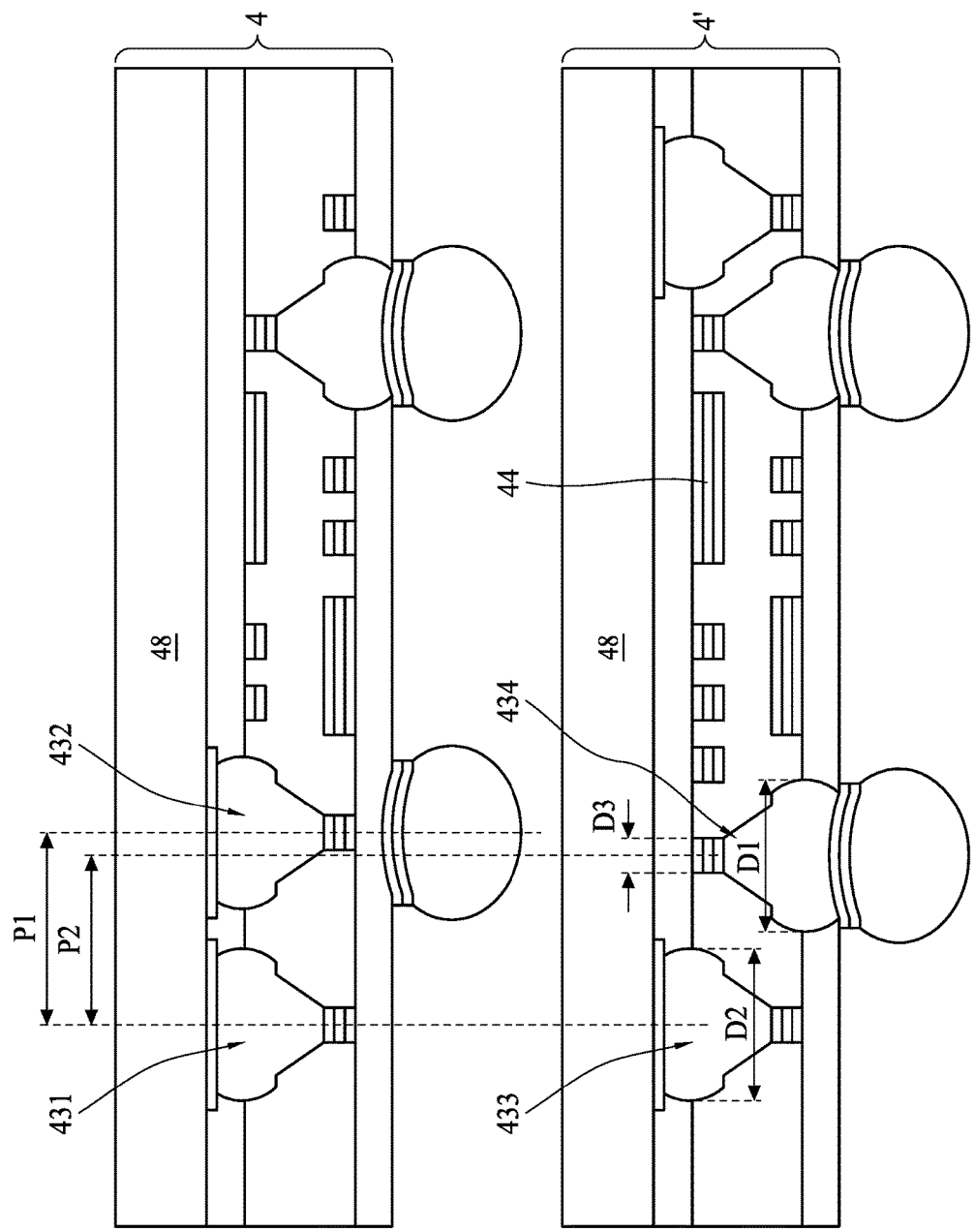
FIG. 4A illustrates a cross-sectional view of two semiconductor package devices in accordance with some embodiments of the present disclosure.

FIG. 4A illustrates a cross-sectional view of two semiconductor package devices in accordance with some embodiments of the present disclosure. Referring to FIG. 4A, a semiconductor package device 4 and a semiconductor package device 4' are provided for comparison. In semiconductor package device 4, the conductive bumps 431 and 432 are disposed on the same side (that is, the active surface of the electronic component 48). P1 indicates a distance between the center of the conductive bump 431 and the center of the conductive bump 432.

In the semiconductor package device 4', the conductive bumps 433 and 434 are disposed in a staggered manner. That is, the conductive bump 433 is disposed on the active surface of the electronic component 48 while the conductive bump 434 is disposed opposite to the active surface of the electronic component 48. P2 indicates a distance between the center of the conductive bump 433 and the center of the conductive bump 434. Referring to FIG. 4A, the distance P2 is less than the distance P1 because in the semiconductor package device 4', the staggered-arranged conductive bumps 433 and 434 can be placed closer without producing a short circuit.

In the semiconductor package device 4', D1 indicates the maximum width of the conductive bump 434 is, D2 indicates the maximum width of the conductive bump 433, and D3 indicates the width of an interface between the protruding portion of the conductive bump 434 and the conductive layer 44. As shown in FIG. 4A, D3 is less than D1 so that the pitch of the conductive layer 44 can be reduced. That is, in existing semiconductor devices, due to manufacturing constraints, the minimum width of a conductive pillar is around 20 µm and thus the minimum width of a conductive layer to which the conductive pillar connects is at least 20 µm. The manufacturing constraints of conductive pillars will result in the constraints of the pitch of the conductive layer.

Figure 4B:
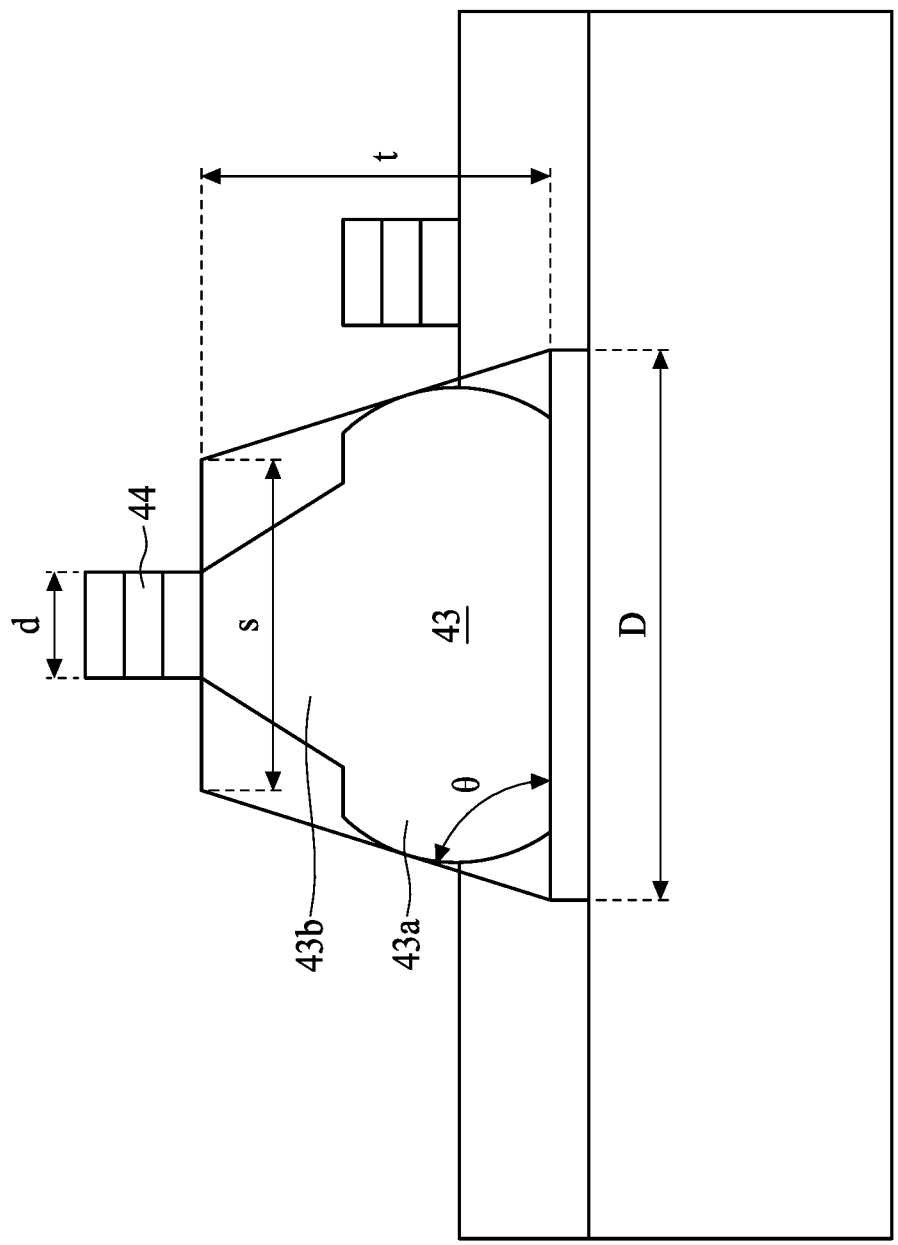
FIG. 4B illustrates a cross-sectional view of a conductive bump in accordance with some embodiments of the present disclosure.

FIG. 4B illustrates a cross-sectional view of a conductive bump 43 in accordance with some embodiments of the present disclosure. In some embodiments, the conductive bump 43 illustrated in FIG. 4B is similar to or identical to the conductive bump 13, 13', 13", 33 or 33' illustrated in FIG. 1, 2B, 3A, 3B, 3C, 3D or 3E. Referring to FIG. 4B, the distance d is the width of an interface between the protruding portion 43$b$ of the conductive bump 43 and the conductive layer 44, D is the width of a bottom surface the conductive bump 43, t is the distance between the interface and the bottom surface the first stud bump, and θ is the angle defined by the bottom surface of the conductive bump 43 and a surface connecting the widest portion of the conductive bump 43 and the edge of the bottom surface of the conductive bump 43. The distance s equals to $D-2(t/\tan\theta)$.

In order to reduce the distance between adjacent conductive bumps and to avoid short circuit between adjacent conductive bumps, the relationship between the distance d and the distance s should be controlled. Referring to FIG. 4B, the distance d is less than the distance s and thus $d<D-2(t/\tan\theta)$. In some embodiments, θ is in a range from about 75 degrees to about 90 degrees. In some embodiments, the width D is equal to or greater than 20 µm. In some embodiments, the distance t is equal to or greater than 25 µm. In some embodiments, the distance d is equal to or less than 6.6 µm.

FIG. 5A, FIG. 5B, FIG. 5C, FIG. 5D, FIG. 5E, FIG. 5F, FIG. 5G, FIG. 5H, FIG. 5I, FIG. 5J, FIG. 5K and FIG. 5L are cross-sectional views of a semiconductor structure at various stages of fabrication, in accordance with some embodiments of the present disclosure. At least some of these figures have been simplified for a better understanding of the aspects of the present disclosure.

Figure 5A:
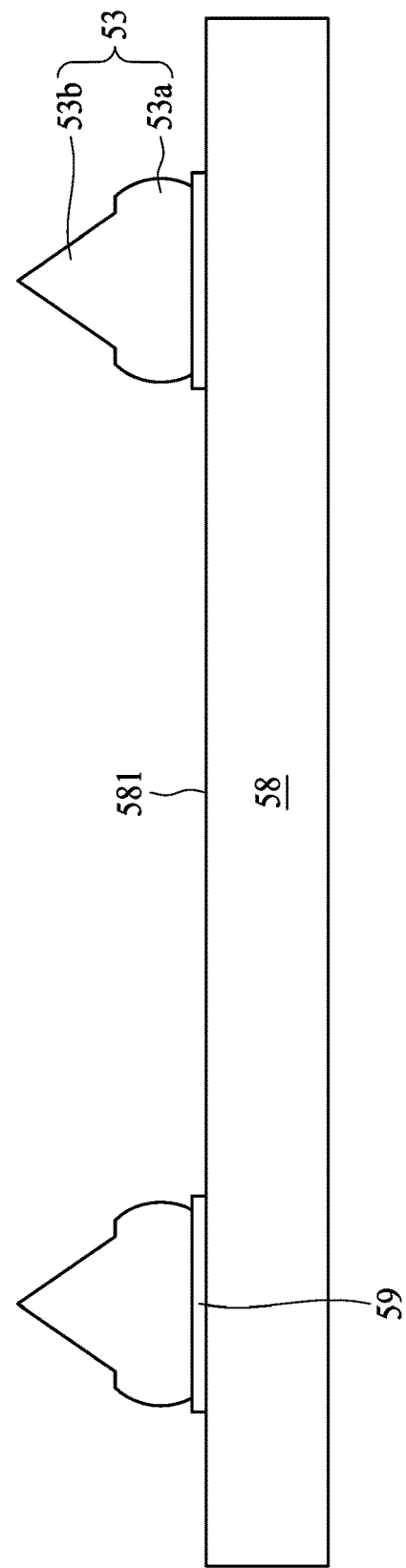
FIG. 5A illustrates one or more stages of a method of manufacturing a semiconductor package device in accordance with some embodiments of the present disclosure.

Referring to FIG. 5A, an electronic component 58 is provided. In some embodiments, the electronic component 58 may be a wafer or a chip. The electronic component 58 has an active surface 581 and a back surface 582 opposite to the active surface 581. A conductive bump 53 (e.g., a stub bump) is bonded to a conductive pad 59 (e.g., a micro pad) on the active surface 581 of the electronic component 58.

The conductive bump 53 includes a main body 53a and a protruding portion 53b disposed on or protruding from the main body 53a. In some embodiments, the conductive bump 53 may be or may include Au, Ag, Cu, another metal, a solder alloy, or a combination of two or more thereof.

Figure 5B:
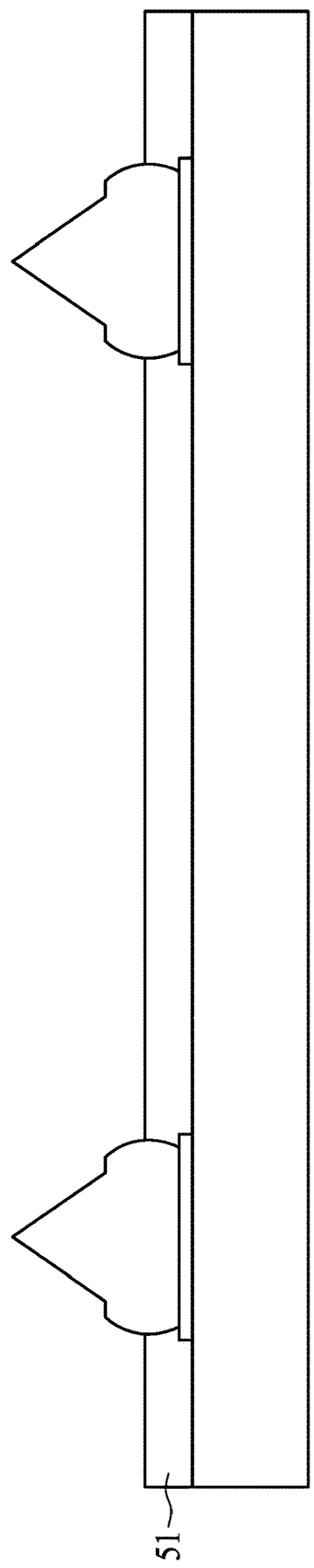
FIG. 5B illustrates one or more stages of a method of manufacturing a semiconductor package device in accordance with some embodiments of the present disclosure.

Referring to FIG. 5B, a passivation layer 51 is disposed on the active surface 581. The passivation layer 51 covers the conductive pad 59 and a portion of the main body 53a of the conductive bump 53. A portion of the main body 53a of the conductive bump 53 is exposed by the passivation layer 51. In some embodiments, the passivation layer 51 includes, for example, one or more organic materials (e.g., a molding compound, BT, a PI, a PBO, a solder resist, an ABF, a PP, an epoxy-based material, or a combination of two or more thereof), inorganic materials (e.g., silicon, a glass, a ceramic, a quartz, or a combination of two or more thereof), liquid-film material(s) or dry-film material(s), or a combination of two or more thereof. In some embodiments, the passivation layer 51 is formed by, for example, coating, lamination or other suitable processes.

Figure 5C:
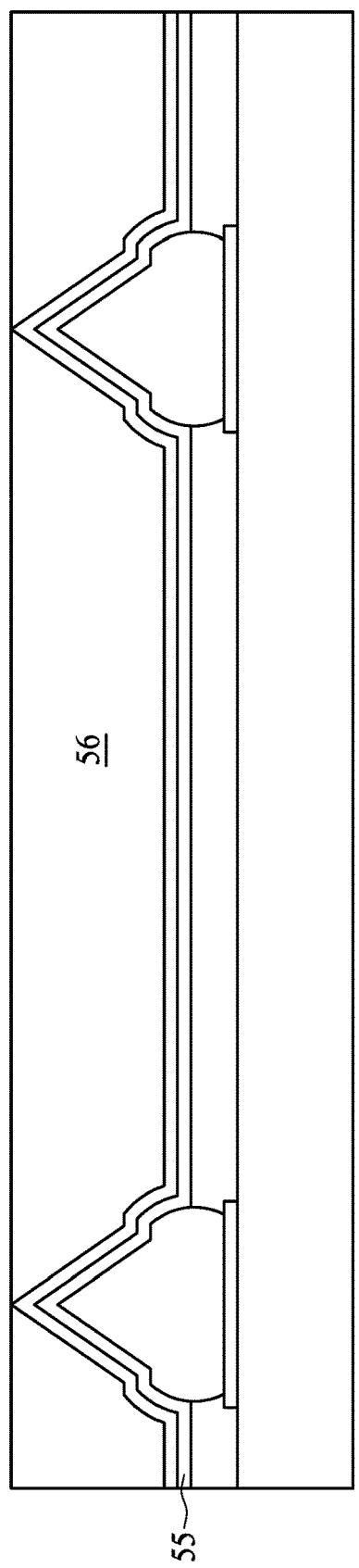
FIG. 5C illustrates one or more stages of a method of manufacturing a semiconductor package device in accordance with some embodiments of the present disclosure.

Referring to FIG. 5C, a conductive layer 55 is formed on the passivation layer 51 and covers the protruding portion 53b of the conductive bump 53 and the exposed portion of the main body 53a of the conductive bump 53. In some embodiments, the conductive layer 55 is substantially conformal to the protruding portion 53b of the conductive bump 53 and the exposed portion of the main body 53a of the conductive bump 53.

In some embodiments, the conductive layer 55 includes a multi-layered structure. In some embodiments, the conductive layer 55 is formed by, for example, physical vapor deposition (PVD). In some embodiments, the conductive layer 55 may be formed by sputtering titanium and copper (Ti/Cu) or a titanium-tungsten alloy (TiW) and then plating at least one of Cu, Ag, Au, or another metal. In some embodiments, the conductive layer 55 may be formed by electroless plating Ni or Cu and then plating Cu, Ag, Au, or another metal. In some embodiments, the conductive layer 55 may be formed by applying Cu, Ag, Au, or another metal and then printing Cu, Ag, Au, or another metal. A photoresist film 56 (or a mask) is formed on the conductive layer 55 by, for example, coating.

Figure 5D:
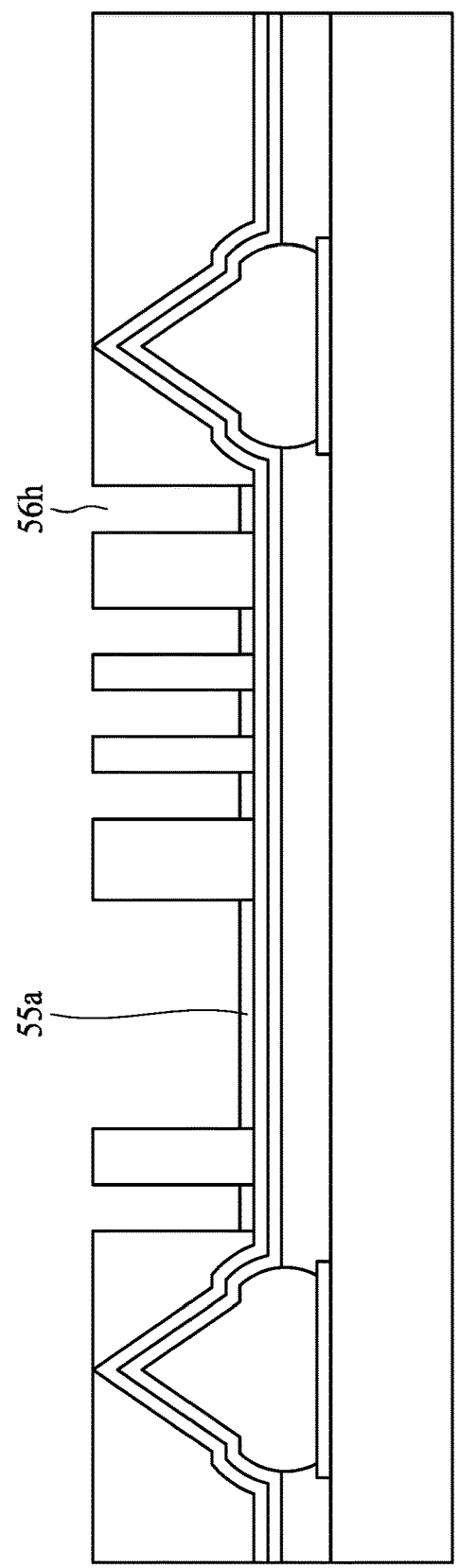
FIG. 5D illustrates one or more stages of a method of manufacturing a semiconductor package device in accordance with some embodiments of the present disclosure.

Referring to FIG. 5D, one or more openings 56h are formed in the photoresist film 56 by, for example, lithographic technique, to expose a portion of the conductive layer 55. A conductive layer 55a is formed on the exposed portion of the conductive layer 55 by, for example, plating. In some embodiments, the conductive layer 55a includes a solder alloy.

Figure 5E:
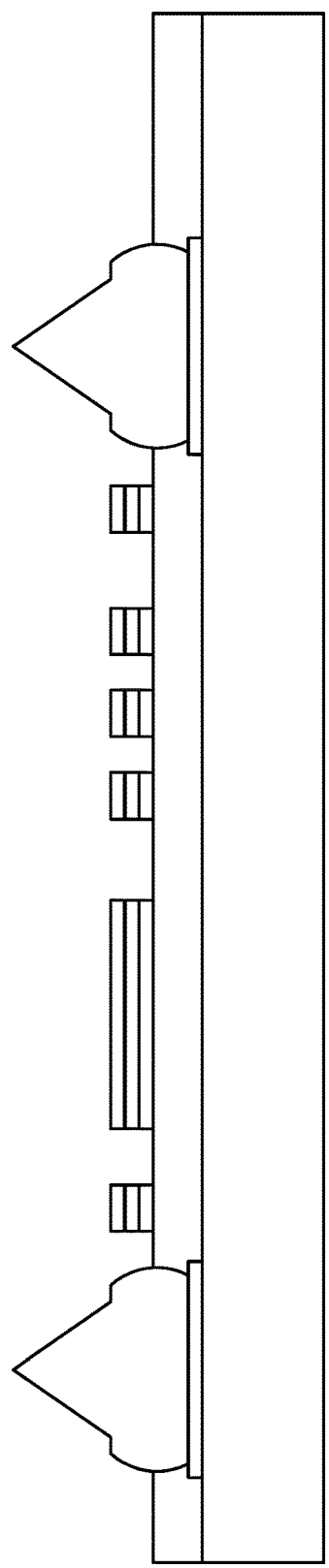
FIG. 5E illustrates one or more stages of a method of manufacturing a semiconductor package device in accordance with some embodiments of the present disclosure.

Referring to FIG. 5E, the photoresist film 56 is removed and a portion of the conductive layer 55 that is not covered by the conductive layer 55a is removed. In some embodiments, the portion of the conductive layer 55 is removed by etching or other suitable processes. The semiconductor structure obtained in the stage shown in FIG. 5E is referred to as a package 5.

Figure 5F:
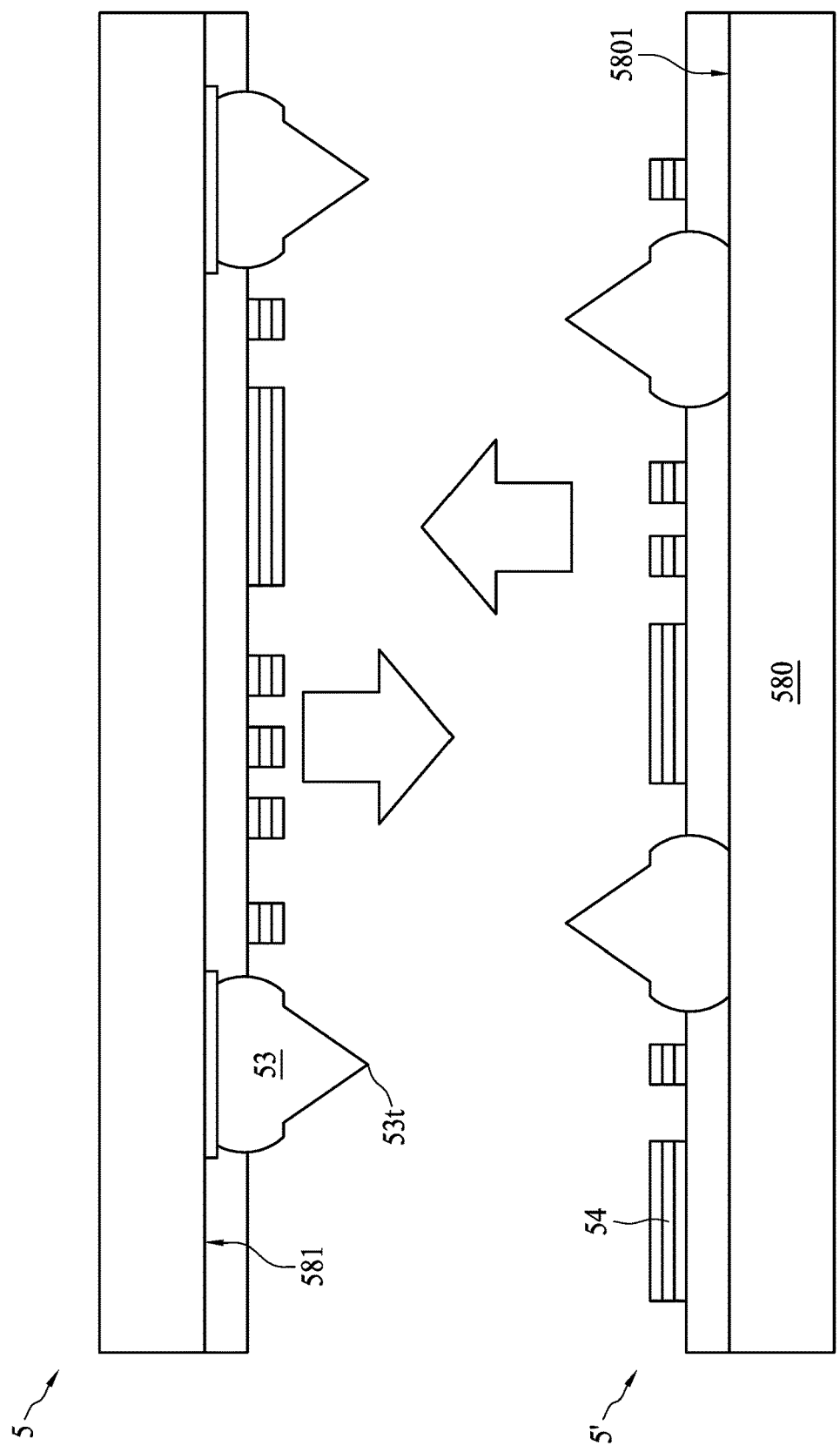
FIG. 5F illustrates one or more stages of a method of manufacturing a semiconductor package device in accordance with some embodiments of the present disclosure.

Referring to FIG. 5F, a package 5 and a package 5' are provided. The package 5 is obtained in the stage of FIG. 5E. The package 5' is formed by methods similar to those shown in FIG. 5A, FIG. 5B, FIG. 5C, FIG. 5D and FIG. 5E, except that the electronic component 58 in FIG. 5A is replaced by a carrier 580, and that the conductive pads 59 in FIG. 5A are eliminated. Packages 5 and 5' are placed aligned with each other, with the surface 581 of the package 5 facing the surface 5801 of the package 5'. The packages 5 and 5' will be placed closer until a tip portion 53t of the conductive bump 53 is inserted into the patterned conductive layer 54 of the package 5'.

Figure 5G:
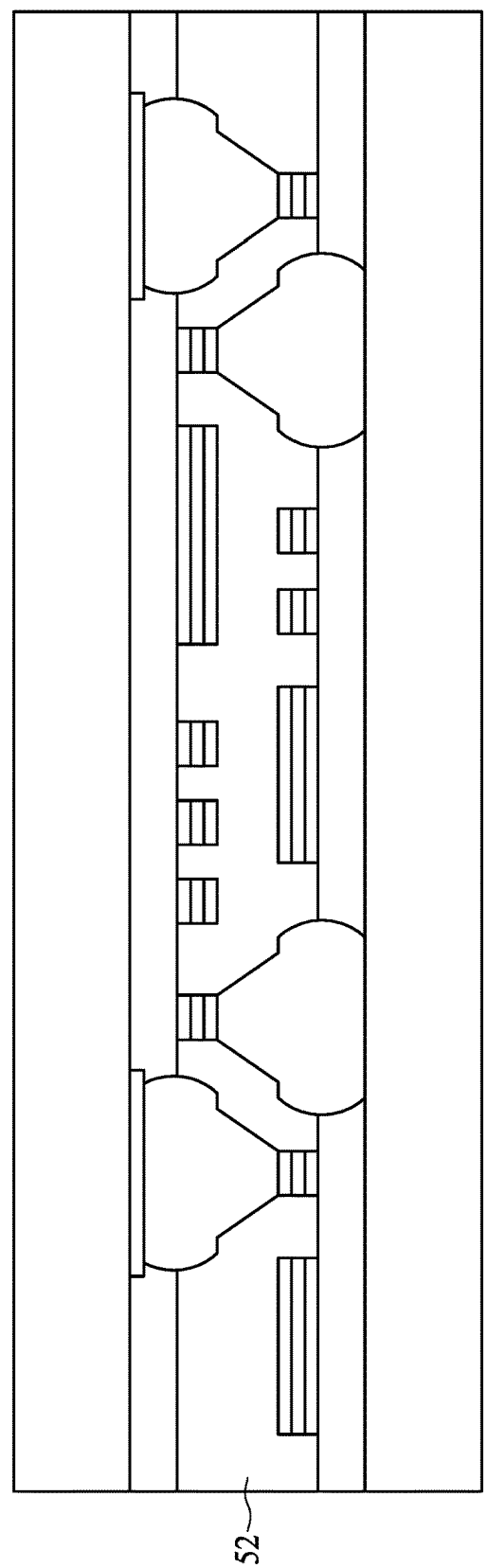
FIG. 5G illustrates one or more stages of a method of manufacturing a semiconductor package device in accordance with some embodiments of the present disclosure.

Referring to FIG. 5G, a passivation layer 52 is formed between the packages 5 and 5'. The passivation layer 52 may be formed by, for example, injection molding techniques or underfill techniques. In some embodiments, the passivation layer 52 includes, for example, one or more organic materials (e.g., a molding compound, BT, a PI, a PBO, a solder resist, an ABF, a PP, an epoxy-based material, or a combination of two or more thereof), inorganic materials (e.g., silicon, a glass, a ceramic, a quartz, or a combination of two or more thereof), liquid-film material(s) or dry-film material(s), or a combination of two or more thereof.

Figure 5H:
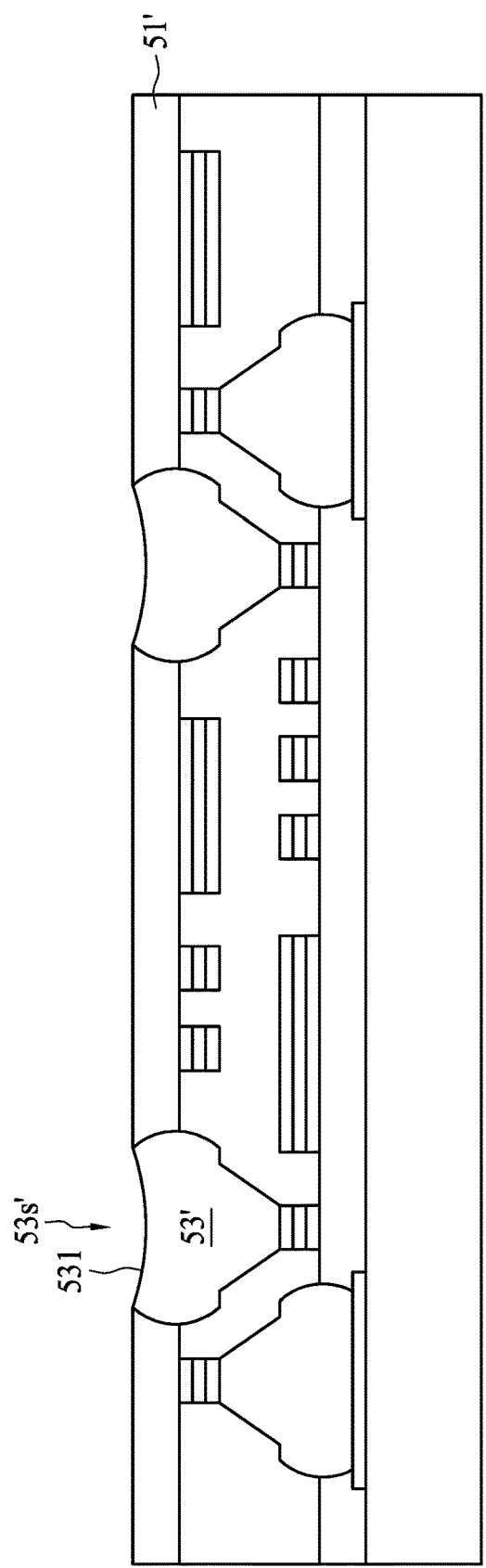
FIG. 5H illustrates one or more stages of a method of manufacturing a semiconductor package device in accordance with some embodiments of the present disclosure.

Referring to FIG. 5H, the carrier 580 is removed to expose the passivation layer 51' and a bottom surface 531 of the conductive bump 53'. The carrier 580 may be removed by, for example, etching or other suitable processes. In some embodiments, a portion of the bottom surface 531 of the conductive bump 53' is removed to form a curved surface/recess 53s' after the etching process. In other embodiments, a substantially flat bottom surface will be formed on the conductive bump 53' after the etching process.

Figure 5I:
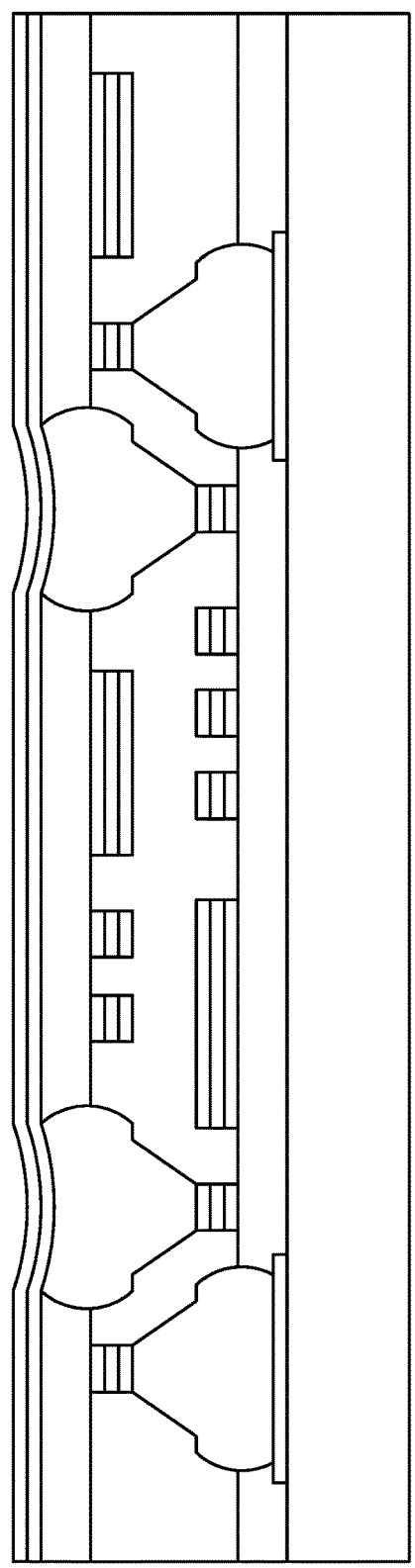
FIG. 5I illustrates one or more stages of a method of manufacturing a semiconductor package device in accordance with some embodiments of the present disclosure.

Referring to FIG. 5I, a conductive layer 57 is disposed on the exposed surface of the passivation layer 51' and the curved surface/recess 53s' of the conductive bump 53'. In some embodiments, the conductive layer 57 is a multi-layered conductive layer. In some embodiments, the conductive layer 57 is formed by, for example, PVD. In some embodiments, the conductive layer 57 may be formed by sputtering Ti/Cu or a TiW and then plating at least one of Cu, Ag, Au, or another metal. In some embodiments, the conductive layer 57 may be formed by electroless plating Ni or Cu and then plating Cu, Ag, Au, or another metal. In some embodiments, the conductive layer 57 may be formed by applying Cu, Ag, Au, or another metal and then printing Cu, Ag, Au, or another metal.

Figure 5J:
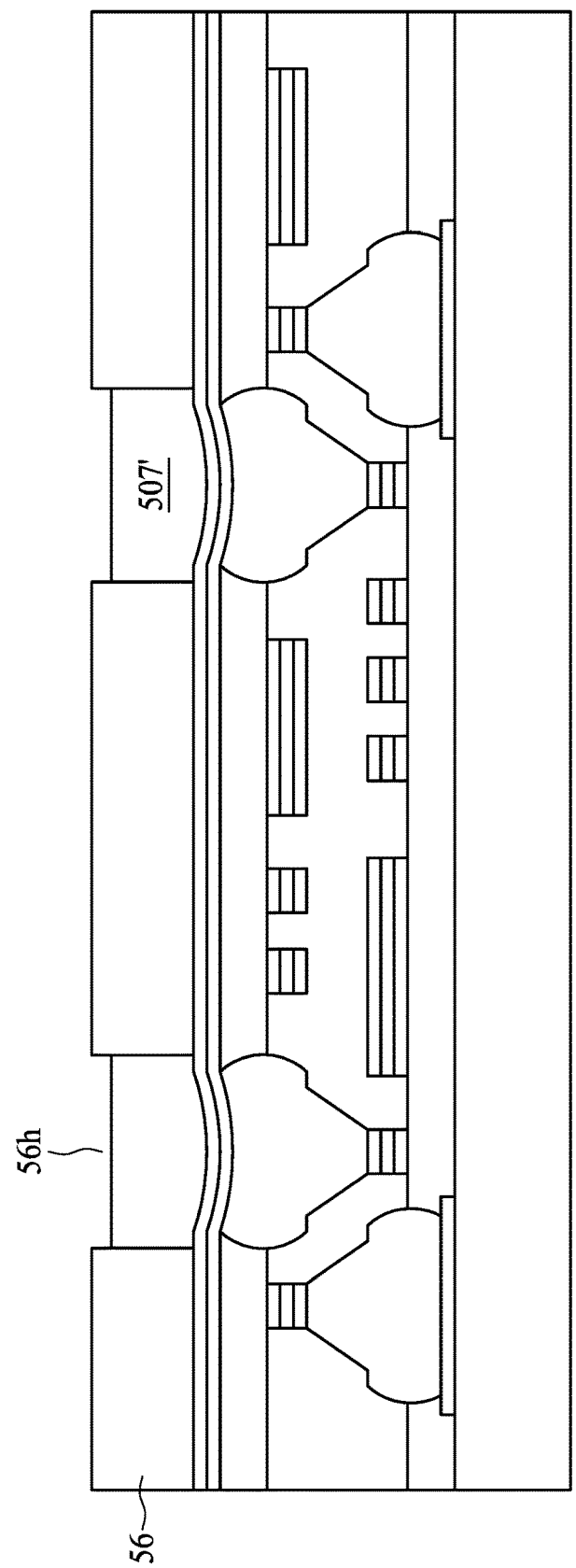
FIG. 5J illustrates one or more stages of a method of manufacturing a semiconductor package device in accordance with some embodiments of the present disclosure.

Referring to FIG. 5J, a photoresist film 56 (or a mask) is formed on the conductive layer 57 by, for example, coating. Openings 56h are formed in the photoresist film 56 by, for example, lithographic technique, to expose a portion of the conductive layer 57. Solder 507' is disposed within the openings 56h.

Figure 5K:
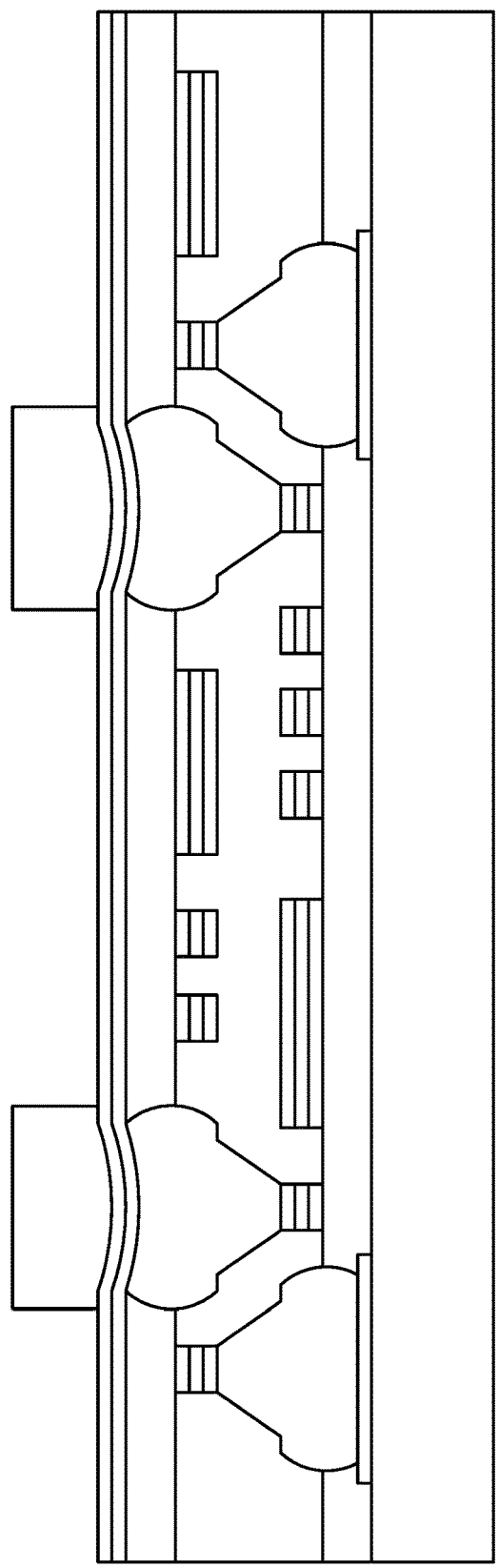
FIG. 5K illustrates one or more stages of a method of manufacturing a semiconductor package device in accordance with some embodiments of the present disclosure.
Figure 5L:
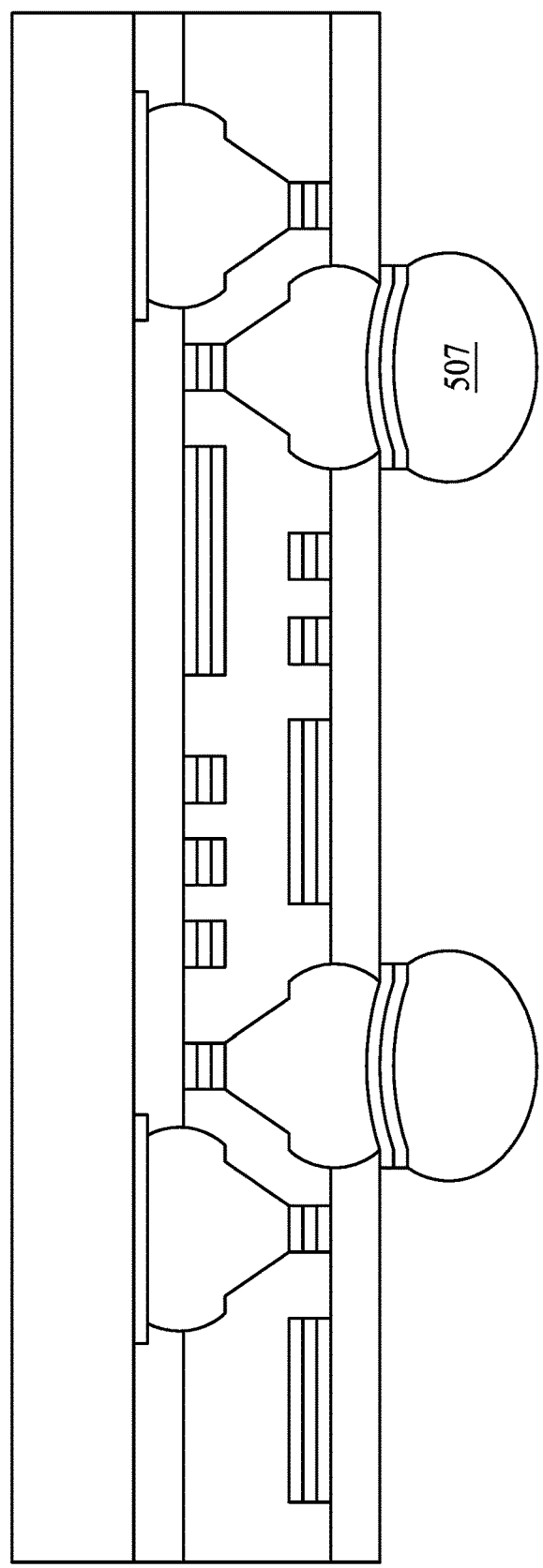
FIG. 5L illustrates one or more stages of a method of manufacturing a semiconductor package device in accordance with some embodiments of the present disclosure.

Referring to FIG. 5K, the photoresist film 56 is removed. Referring to FIG. 5L, a reflow process is carried out to shape the solder 507' into solder balls 507. The semiconductor package device obtained in the stage of FIG. 5L is substantially identical to that shown in FIG. 3A.

FIG. 6A, FIG. 6B, FIG. 6C, FIG. 6D, FIG. 6E and FIG. 6F are cross-sectional views of a semiconductor structure at various stages of fabrication, in accordance with some embodiments of the present disclosure. At least some of these figures have been simplified for a better understanding of the aspects of the present disclosure.

Figure 6A:
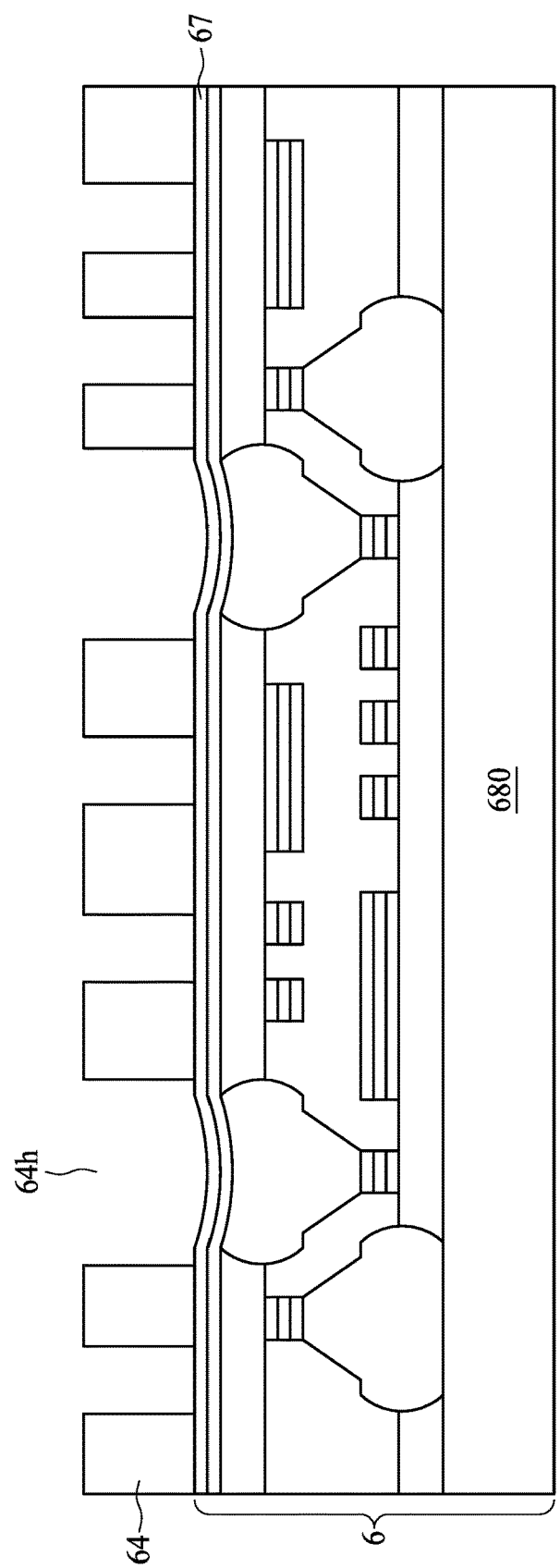
FIG. 6A illustrates one or more stages of a method of manufacturing a semiconductor package device in accordance with some embodiments of the present disclosure.

Referring to FIG. 6A, a package 6 is provided with a patterned photoresist film (or a mask) 64 formed on the package 6. The package 6 is formed by methods similar to those shown in FIG. 5A, FIG. 5B, FIG. 5C, FIG. 5D, FIG. 5E, FIG. 5F, FIG. 5G, FIG. 5H and FIG. 5I, except that the electronic component 58 in FIG. 5A is replaced by a carrier 680, and that the conductive pads 59 in FIG. 5A are eliminated. The patterned photoresist film 64 is formed on the conductive layer 67 using, for example, coating and lithographic techniques. One or more openings 64h are formed in the photoresist film 64 by lithographic technique to expose portions of the conductive layer 67.

Figure 6B:
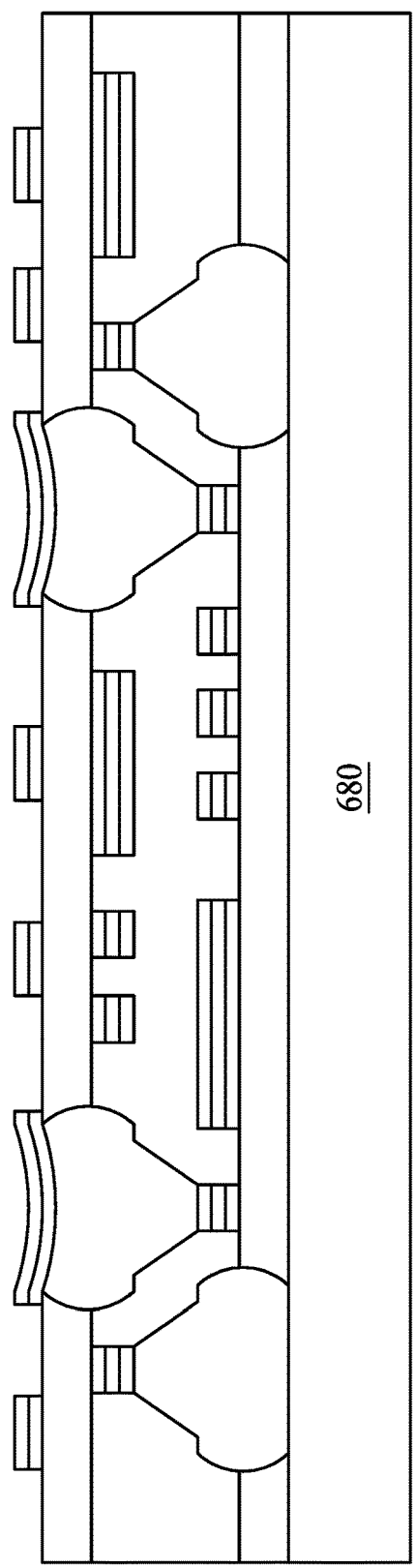
FIG. 6B illustrates one or more stages of a method of manufacturing a semiconductor package device in accordance with some embodiments of the present disclosure.

Referring to FIG. 6B, the patterned photoresist film 64 is removed and a portion of the conductive layer 67 that is not covered by the patterned photoresist film 64 is removed. In some embodiments, the portion of the conductive layer 67 is removed by etching or other suitable processes.

Figure 6C:
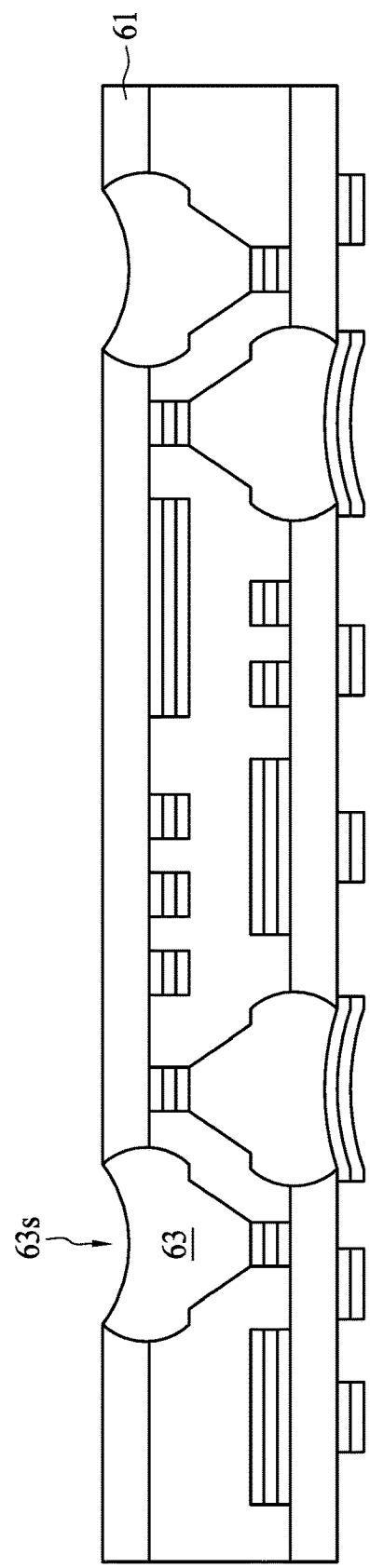
FIG. 6C illustrates one or more stages of a method of manufacturing a semiconductor package device in accordance with some embodiments of the present disclosure.

Referring to FIG. 6C, the substrate 680 is removed to expose the passivation layer 61. The carrier 680 may be removed by, for example, etching or other suitable processes. In some embodiments, a curved surface/recess 63s is formed on the conductive bump 63 after the etching process. In other embodiments, a substantially flat surface will be formed on the conductive bump 63 after the etching process.

Figure 6D:
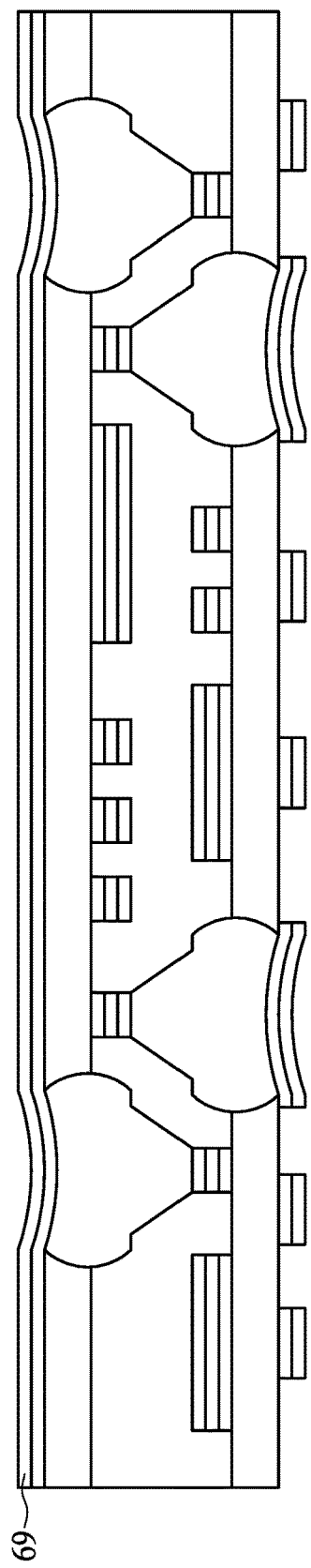
FIG. 6D illustrates one or more stages of a method of manufacturing a semiconductor package device in accordance with some embodiments of the present disclosure.

Referring to FIG. 6D, a conductive layer 69 is disposed on the exposed surface of the passivation layer 61 and the curved surface/recess 63s of the conductive bump 63. In some embodiments, the conductive layer 69 is a multi-layered conductive layer.

Figure 6E:
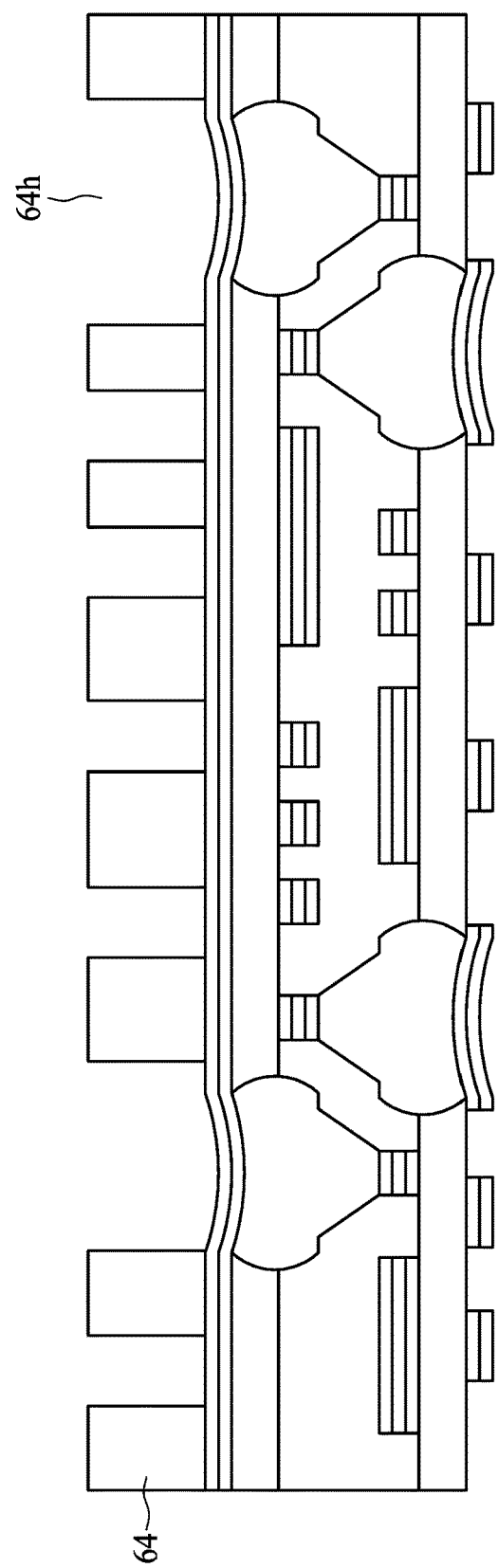
FIG. 6E illustrates one or more stages of a method of manufacturing a semiconductor package device in accordance with some embodiments of the present disclosure.

Referring to FIG. 6E, a patterned photoresist film (or a mask) 64 is formed on the conductive layer 69. One or more openings 64h are formed in the photoresist film 64 by, for example, lithographic technique, to expose portions of the conductive layer 69.

Figure 6F:
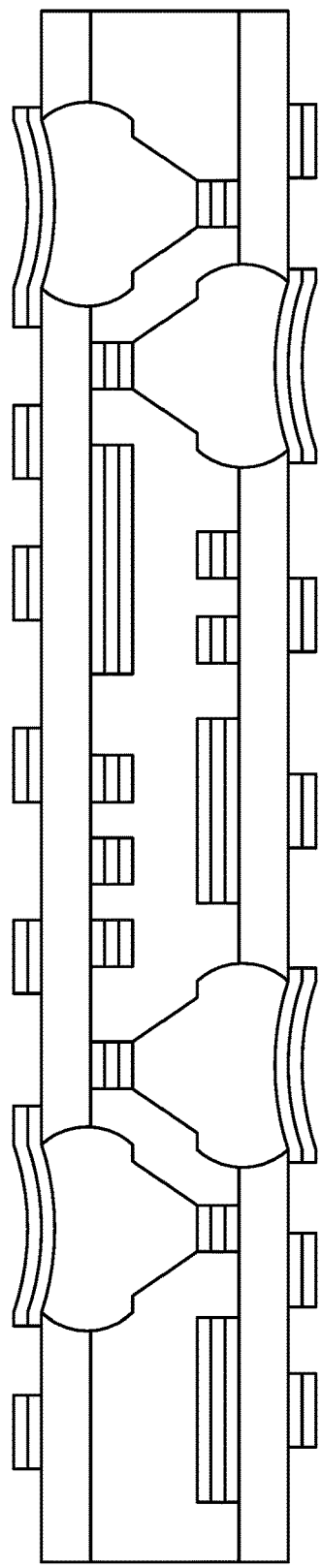
FIG. 6F illustrates one or more stages of a method of manufacturing a semiconductor package device in accordance with some embodiments of the present disclosure.

Referring to FIG. 6F, the patterned photoresist film 64 is removed and a portion of the conductive layer 69 that is not covered by the patterned photoresist film 64 is removed. In some embodiments, the portion of the conductive layer 69 is removed by etching or other suitable processes. The semiconductor package device obtained in the stage of FIG. 6F is substantially identical to that shown in FIG. 1.

Figure 7B:
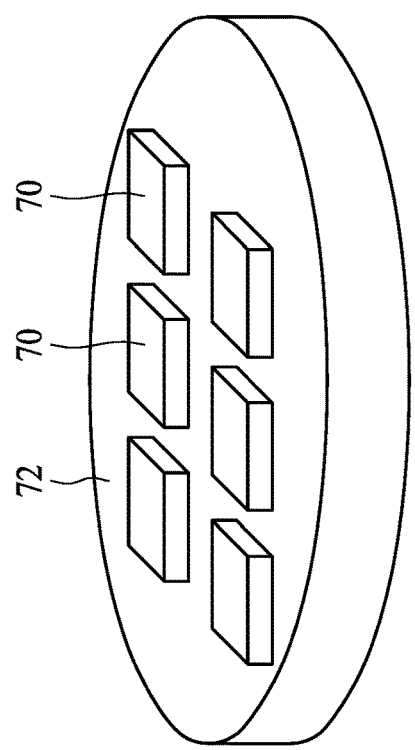
FIG. 7B illustrates examples of various types of semiconductor package devices in accordance with some embodiments of the present disclosure.
Figure 7A:
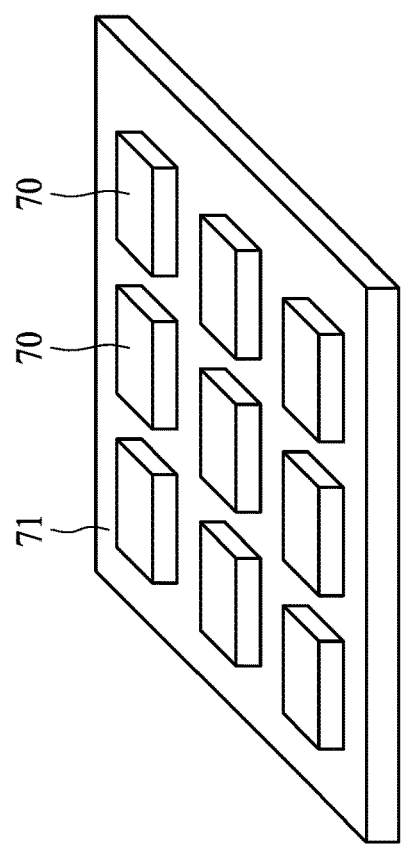
FIG. 7A illustrates examples of various types of semiconductor package devices in accordance with some embodiments of the present disclosure.

FIG. 7A and FIG. 7B illustrate examples of different types of semiconductor package devices in accordance with some embodiments of the present disclosure.

As shown in FIG. 7A, a plurality of chips 70 and/or dies are placed on a square-shaped carrier 71. In some embodiments, at least one of the chips 70 includes the semiconductor package device as shown in FIG. 2A, 2B, 3A, 3B, 3C, 3E or 3E. In some embodiments, the carrier 71 may include organic materials (e.g., a molding compound, BT, a PI, a PBO, a solder resist, a ABF, a PP, an epoxy-based material, or a combination of two or more thereof) or inorganic materials (e.g., silicon, a glass, a ceramic, a quartz, or a combination of two or more thereof).

As shown in FIG. 7B, a plurality of chips 70 and/or dies are placed on a circle-shaped carrier 72. In some embodiments, the carrier 72 may include organic materials (e.g., a molding compound, BT, a PI, a PBO, a solder resist, an ABF, a PP, an epoxy-based material, or a combination of two or more thereof) or inorganic materials (e.g., silicon, a glass, a ceramic, a quartz, or a combination of two or more thereof).

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be planar or substantially planar if a displacement of the surface relative to a flat plane between any two points on the surface is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

Spatial descriptions, such as "above," "below," "up," "left," "right," "down," "top," "bottom," "vertical," "horizontal," "side," "higher," "lower," "upper," "over," "under," "downward," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
a first circuit layer having a first conductive layer and a first stud bump; and
a second circuit layer having a second conductive layer and a second stud bump, wherein
the first stud bump has a first portion and a second portion, and the second portion of the first stud bump is electrically connected to the second conductive layer;
the second stud bump has a first portion and a second portion, and the second portion of the second stud bump is electrically connected to the first conductive layer;
the first stud bump partially overlaps the second stud bump in a direction substantially perpendicular to the first circuit layer; and
the first portion of the first stud bump is spaced apart from the first conductive layer at a first distance, and the first distance is equal to or less than 5 micrometers ($\mu$m).

2. The semiconductor package device of claim 1, wherein the first distance is equal to or greater than 2 $\mu$m.

3. The semiconductor package device of claim 1, wherein the first portion of the second stud bump is spaced apart from the second conductive layer at a second distance, and the second distance is substantially equal to the first distance.

4. The semiconductor package device of claim 1, wherein a width of the first portion of the first stud bump is greater than a width of the second portion of the first stud bump.

5. The semiconductor package device of claim 1, wherein d<D−2(t/tan θ);
where d is the width of an interface between the second portion of the first stud bump and the second conductive layer, D is the width of a bottom surface the first stud bump, t is the distance between the interface and the bottom surface the first stud bump, and θ is the angle defined by the bottom surface of the first stud bump and a surface connecting the widest portion of the first stud bump and the edge of the bottom surface of the first stud bump.

6. The semiconductor package device of claim 1, further comprising a passivation layer disposed between the first circuit layer and the second layer and covering the first stud bump and the second stud bump.

7. The semiconductor package device of claim 1, wherein the first circuit layer further comprises a passivation layer, the passivation layer having a first surface facing toward the second circuit layer and a second surface opposite to the first surface;
the first conductive layer is disposed on the first surface of the passivation layer; and
at least a portion of the first portion of the first stud bump is embedded within the passivation layer.

8. The semiconductor package device of claim 7, wherein the second surface of the passivation layer defines a recess to expose the portion of the first portion of the first stud bump.

9. The semiconductor package device of claim 8, further comprising a third conductive layer disposed on the second surface of the passivation layer and electrically connected to the exposed portion of the first portion of the first stud bump.

10. The semiconductor package device of claim 9, further comprising:
a die electrically connected to the third conductive layer; and
a second package body disposed on the second surface of the passivation layer and covering the die and the third conductive layer.

11. A semiconductor package device, comprising:
a first circuit layer having a first conductive layer and a first stud bump; and
a second circuit layer having a second conductive layer and a second stud bump, wherein
the first stud bump has a first portion and a second portion, and the second portion of the first stud bump is electrically connected to the second conductive layer;
the second stud bump has a first portion and a second portion, and the second portion of the second stud bump is electrically connected to the first conductive layer, wherein d<D−2(t/tan θ);
where d is the width of an interface between the second portion of the first stud bump and the second conductive layer, D is the width of a bottom surface the first stud bump, t is the distance between the interface and the bottom surface the first stud bump, and θ is the angle defined by the bottom surface of the first stud bump and a surface connecting the widest portion of the first stud bump and the edge of the bottom surface of the first stud bump.

12. The semiconductor package device of claim 11, wherein the first portion of the first stud bump is spaced apart from the first conductive layer at a first distance, and the first distance is equal to or less than 5 micrometers ($\mu$m).

13. The semiconductor package device of claim 12, wherein the first distance is equal to or greater than 2 $\mu$m.

14. The semiconductor package device of claim 12, wherein the first portion of the second stud bump is spaced apart from the second conductive layer at a second distance, and the second distance is substantially equal to the first distance.

15. The semiconductor package device of claim 11, wherein a width of the first portion of the first stud bump is greater than a width of the second portion of the first stud bump.

16. A semiconductor package device, comprising:
a first circuit layer having a first conductive layer and a first stud bump; and
a second circuit layer having a second conductive layer and a second stud bump, wherein
the first stud bump has a first portion and a second portion, and the second portion of the first stud bump is electrically connected to the second conductive layer;
wherein a width of the widest portion of the first stud bump is greater than a width of an interface between the second portion of the first stud bump and the second conductive layer, and wherein the first portion of the first stud bump is spaced apart from the first conductive layer at a first distance, and the first distance is equal to or less than 5 micrometers ($\mu$m).

17. The semiconductor package device of claim 16, wherein:
the second stud bump has a first portion and a second portion, and the second portion of the second stud bump is electrically connected to the first conductive layer; and
a width of the widest portion of the second stud bump is greater than a width of an interface between the second portion of the second stud bump and the first conductive layer.

18. The semiconductor package device of claim 17, wherein the first portion of the second stud bump is spaced apart from the second conductive layer at a second distance, and the second distance is substantially equal to the first distance.

19. The semiconductor package device of claim 16, wherein
the first circuit layer further comprises a passivation layer, the passivation layer having a first surface facing toward the second circuit layer and a second surface opposite to the first surface;
the first conductive layer is disposed on the first surface of the passivation layer;
at least a portion of the first portion of the first stud bump is embedded within the passivation layer; and
the second surface of the passivation layer defines a recess to expose the portion of the first portion of the first stud bump.

20. The semiconductor package device of claim 19, further comprising a third conductive layer disposed on the second surface of the passivation layer and electrically connected to the exposed portion of the first portion of the first stud bump.

* * * * *